United States Patent [19]

Agrawal et al.

[11] Patent Number: 5,781,030
[45] Date of Patent: Jul. 14, 1998

[54] PROGRAMMABLE UNIFORM SYMMETRICAL DISTRIBUTION LOGIC ALLOCATOR FOR A HIGH-DENSITY COMPLEX PLD

[75] Inventors: Om P. Agrawal, Los Altos; Bradley A. Sharpe-Geisler, San Jose, both of Calif.

[73] Assignee: Advanced Micro Devices, Inc., Sunnyvale, Calif.

[21] Appl. No.: 459,234

[22] Filed: Jun. 2, 1995

[51] Int. Cl.[6] .......................... H03K 7/38; H03K 19/177
[52] U.S. Cl. ........................ 326/39; 326/41; 326/38
[58] Field of Search ........................ 326/38, 39, 41

[56] References Cited

U.S. PATENT DOCUMENTS

| | | |
|---|---|---|
| 4,758,746 | 7/1988 | Birkner et al. . |
| 4,878,200 | 10/1989 | Asghar et al. . |
| 5,015,884 | 5/1991 | Agrawal et al. . |
| 5,130,574 | 7/1992 | Shen et al. .......................... 326/39 |
| 5,151,623 | 9/1992 | Agrawal et al. . |
| 5,225,719 | 7/1993 | Agrawal . |
| 5,309,046 | 5/1994 | Steele .......................... 326/39 |
| 5,341,044 | 8/1994 | Ahanin et al. .......................... 326/41 |
| 5,404,055 | 4/1995 | Shankar .......................... 326/41 |
| 5,457,409 | 10/1995 | Agrawal .......................... 326/39 |
| 5,471,155 | 11/1995 | Steele .......................... 326/41 |
| 5,485,104 | 1/1996 | Agrawal .......................... 326/41 |
| 5,489,857 | 2/1996 | Agrawal .......................... 326/41 |

FOREIGN PATENT DOCUMENTS 584 911 A1  3/1994  European Pat. Off. ..... H03K 19/177

OTHER PUBLICATIONS

Elektor Electronics, vol. 20, No. 227, issued 1 Nov. 1994, pp. 8-11, XP00047991 "Low Cost ispLSI Programmer".

Primary Examiner—Edward P. Westin
Assistant Examiner—Richard Roseen
Attorney, Agent, or Firm—Skjerven, Morrill, MacPherson, Franklin & Friel LLP; Forrest E. Gunnison

[57] ABSTRACT

A programmable uniform distribution logic allocator enhances the speed, silicon utilization, logic efficiency, logic utilization, and scalability of very high-density CPLDs including the logic allocator. The programmable uniform distribution logic allocator provides a uniform number of product terms to each I/O pin of the CPLDS and the same uniform number of product terms as feedback. However, no product terms are permanently connected to either a particular macrocell or a particular I/O pin. The programmable uniform distribution logic allocator includes a multiplicity of router elements where each router element steers a sum of a selected number of sum-of-product terms from a PAL structure, i.e. a selected number of logic product term-clusters, to a programmably selected logic macrocell. Specifically, the programmable uniform distribution logic allocator has a plurality of input lines, a plurality of output lines and a plurality of programmable router elements. Each programmable router element has an input terminal connected to an input line in the plurality of input lines and an output terminal connected to an output line in the plurality of output lines. Also, each programmable router element is programmably connectable to and disconnectable from each of input lines connected to the plurality of programmable router elements so that each output line has access to all input signals on the plurality of input lines.

7 Claims, 15 Drawing Sheets

PROGRAMMABLE UNIFORM SYMMETRICAL DISTRIBUTION LOGIC ALLOCATOR FOR A HIGH-DENSITY COMPLEX PLD

FIELD OF THE INVENTION

This invention relates generally to programmable logic block cell structures and in particular to a programmable logic allocator in a very high-density complex programmable logic device (CPLD) that provides enhanced logic utilization and enhanced logic efficiency.

DESCRIPTION OF RELATED ART

Programmable logic device (PLD) designers have consistently sought to maximize logic efficiency for a fixed amount of logic resources. One measure of logic efficiency in a programmable logic device is the number of product terms available per input/output (I/O) pin and the number of product terms at each node, usually a macrocell output line, that can be fedback to a programmable array in the PLD. Typically, in a programmable logic device, the product terms are not connected directly to an I/O pin but rather reach the I/O pin through a macrocell and perhaps other logic. Nevertheless, in each PLD, a specific number of product terms can be associated with each input/output pin. Similarly, a specific number of product terms can be associated with the output line of the macrocell or other logic.

Historically, low-density PLDs encompass monolithic block-based structures in 20- to 28-pin packages with a density ranging from eight to sixteen macrocells. The architecture of a typical low-density PLD includes a programmable array logic (PAL) (PAL is a registered U.S. trademark of Advanced Micro Devices of Sunnyvale, Calif.), or a field programmable logic array (FPLA) with an integrated array of logic, I/O macrocells, and I/O pins.

Fundamentally, a simple PAL architecture incorporates a two-level logic array that has a programmable-AND plane, that consists of multiple product terms, and a fixed-OR plane. FPLA devices have both a programmable-AND plane and a programmable-OR plane. Typically, any logic function can be implemented in a low-density PAL device as long as the design requirements do not exceed the number of input signals, output signals, the logic product terms, and other logic functions, such as registers, clocks, polarity control etc., that are available in the PAL device.

The low-density PAL device is a simple structure and has the advantage of higher speed in comparison to a FPLA. In the low-density PAL device, a fixed and equal amount of logic, i.e., number of product terms, was associated with each output pin. Seven or eight product terms per each output pin was typical for first and second generation bipolar and CMOS PAL devices such as 16xx, 20xx, 16V8 and 20V8. One example of a low-density PAL device is shown in Birkner et al., U.S. Pat. No. 4,124,899 entitled "Programmable Array Logic Circuit" and issued on Nov. 7, 1978, which is incorporated herein by reference in its entirety.

These low-density PAL devices had a fully committed structure which means that all of the internal elements and fixed logic allocation structure are closely coupled. The closely coupled structure, e.g., a PAL structure with a fixed product-term distribution, has several advantages including regularity or symmetry; a simple structure; a known amount of logic with each output pin; and ease of design changes.

While a PAL structure with a fixed product-term distribution had the above advantages, a fixed allocation of product terms had some major disadvantages. Since the number of product terms in the low-density PAL devices for each output pin was fixed and not steerable or sharable between adjacent output pins, the product terms associated with a particular output pin were wasted if that output pin was not utilized. Thus, the silicon efficiency was low.

Another major disadvantage of a fixed product-term distribution per output pin was that an optimal allocation of logic resources was not possible in most cases. Different logic applications seldom need the same and equal number of product terms for all output pins. There are many occasions when seven to eight product terms per output pin are not enough to handle complex logic functions, especially for complex state machines. Applications requiring only one more product-term than the fixed number of product terms for only one output pin cannot be implemented in a low-density PAL device.

Experience has shown that for a broad range of applications, eight product terms per output pin are on average more than enough. However, as for any average, eight product terms are insufficient in some cases. For example, FIG. 2 in Munoz et. al., "Automatic Partitioning of Programmable Logic devices," *VLSI Systems Design Magazine*, pp 74–78, October 1987, is a graph of product-term requirements for a relatively large sample of logic functions. This and other studies have shown that a large percentage of logic functions (on the order of 30 to 40%) require less than four product terms. However, a relatively significant "tail" exists where eight product terms are not enough.

One way to achieve increased product-term utilization over the fixed product-term distribution in low-density PAL devices is to provide a PLD with a fixed, variable product-term distribution per output pin. The concept behind the fixed, variable product-term distribution was to have a judicious allocation of logic resources and to allocate product terms in a variable but fixed distribution fashion such that some OR gates are driven by a few product terms, e.g., four or eight, and other OR gates are driven by a relatively large number of product terms, e.g., twelve or sixteen.

One of the first PAL devices to introduce a variable product-term distribution was sold by Advanced Micro Devices (AMD) of Sunnyvale, Calif. under Model No. PAL22V10. The number of product terms per I/O pin in the PAL22V10, architecture was 8, 10, 12, 14, 16, 16, 12, 14, 12, 10, and 8. This fixed, variable, static distribution of product terms enhanced the PAL device's logic utilization by allowing use of the PAL device in a broader range of applications. Various PLDs that have incorporated the fixed, variable, static distribution of product terms include PLDs sold by AMD under Model Nos. PALCE22V10 and PALCE29M16/29MA16. U.S. Pat. No. 4,717,912 issued to Harvey et. al., in January 1988, which is incorporated herein by reference in its entirety, illustrates a PLD with a fixed, variable product-term distribution.

While the fixed, variable distribution of product terms also results in a potentially better allocation of resources, thereby enhancing product-term utilization over a comparable PLD with a fixed allocation of product terms, the fixed, variable distribution of product terms also results in a potentially inefficient silicon structure. Specifically, this product-term distribution increases the average number of product terms per output pin over the low-density PAL structures. The increase in the average number of product terms results in a bigger die size, potentially slower speed, and a greater likelihood of wasted resources.

The fixed, variable distribution of product terms restricts only a limited number of output macrocells and output pins to the largest amount of logic, and system designers have to pre-assign logic functions that require larger logic resources to only those particular output pins. Also, since the product-term distribution is fixed, output pins with a smaller number of product terms do not have access to unused product-term resources from other macrocells. This results in potential waste of internal resources. Extension of the fixed, variable product-term distribution to higher density devices with more output pins and macrocells would result in significantly larger, more expensive and slower devices.

The fixed, variable product-term distribution increases the complexity of the logic fitting software task because each user logic function must be examined and then, depending upon the demand for product-term resources, assigned to a specific output macrocell which has the minimum product terms needed to fulfill the required product-term demand. This software complexity becomes significantly worse for multiple interconnected programmable logic blocks that each have a fixed, variable product-term distribution.

The programmable logic devices disclosed in U.S. Pat. No. 5,015,884 entitled "Multiple Array High Performance Programmable Logic Device Family" of Om P. Agrawal et al. issued on May 14, 1991, and in U.S. Pat. No. 5,225,719 entitled "Family of Multiple Segmented Programmable Logic Blocks Interconnected by a High Speed Centralized Switch Matrix" of Om P. Agrawal et al. issued on Jul. 6, 1993, both of which are incorporated herein by reference in their entirety, eliminated the fixed connectivity of product terms to a macrocell and consequently an output pin. A programmable logic allocator 111 (FIG. 1) was inserted between a product-term array 110 and the logic that coupled the product terms to the I/O pins. In that PLD, each product-term cluster had four product terms, and the maximum number of product-term clusters steered to an I/O pin was three.

In FIG. 1, boxes L1 through L16 on the left-hand side of the figure, each of which contains the numeral "4", represent the four product-term clusters in product-term array 110. Four product-term clusters were used because extensive studies of applications indicated that four to sixteen product terms per macrocell, preferably with D and T type flip-flops, allows addressing 90–95% of PAL replacement application needs. Also, it was found that any amount of fixed allocation of resources with output pins resulted in potential waste of resources.

On the right-hand side of FIG. 1 are sixteen boxes R1 through R16 which represent logic that couples the output signals of logic allocator 111 to the I/O pins. The number within boxes R1 to R16 is the maximum number of product terms that logic allocator 111 can route to a macrocell and consequently a particular I/O pin. Each line within logic allocator 111 represents a router element, and the numbers on a line within logic allocator 111 represent the product-term clusters, as numbered on the left-hand side of the figure, that can be steered to an I/O pin by that router element. Thus, in this PLD, an output terminal of the router element is programmably connectable to a maximum of three product-term clusters.

Logic allocator 111 provided programmable connectivity between product-term resources and macrocells, and so removed the limitation of fixed connectivity. No fixed amount of logic was associated with any macrocell, but some macrocells had the flexibility to receive up to twelve product terms of logic, when needed. Since the macrocells were coupled directly to I/O pins, each I/O pin had access to the same logic as the macrocell to which the I/O pin was coupled.

Logic allocator 111 was structured to achieve a balance between speed and logic flexibility. Logic allocator 111 allowed a product-term cluster to be steered to either two or three adjacent macrocells with no or minimal speed penalty. Also, symmetry was compromised for speed by not allowing complete wrap-around at the ends of logic allocator 111. Wrap-around capability introduces additional speed delay. Alternatively, additional product-term resources could have been used to simulate complete wrap-around. However, this results in a larger die size.

While logic allocator 111 permitted steering of a product-term cluster and hence improved logic flexibility, logic allocator 111 did not allow product-term sharing. While the product-term clusters are available to multiple macrocells, a product-term cluster can be used by only one logic macrocell. Thus, product-term clusters are essentially stolen from adjacent logic macrocells. Once stolen, a product-term cluster was not available to other macrocells.

The operation of logic allocator 111 has implications in fitting a user logic design to the PLD. After a user has pre-placed some of the output pins and fixed the logic design, a subsequent change to the logic, that had once fitted nicely in the PLD, could potentially result in logic that no longer fit after the logic change. This can create a problem for board designers. This particular restriction may force a user to finish the board design before the board layout. This often can be a bottleneck for time-to-market considerations.

To illustrate the limitations of logic allocator 111, consider a PLD with a programmable logic block that includes eight macrocells R1 to R8, a logic allocator 111A, and a PAL array 110A with eight four product-term clusters C1 to C8. FIG. 2A illustrates the product-term clusters available to each router element in logic allocator 111. FIGS. 2B to 2J illustrate alternative configurations of the PLD upon programming logic allocator 111A. Specifically, FIGS. 2B to 2J illustrate connection of the specific product terms on the line representing the router element to the associated macrocell.

Logic allocator 111A (FIG. 2A) can steer a product-term to a maximum of any one of three adjacent macrocells but steering is not allowed to wrap-around at the ends of logic allocator 111A. As shown in FIG. 2B, each of macrocells R1 to R8 can have an average of four product terms without any problem.

If there is a need for increased flexibility, only certain combination of macrocells R1 to R8 and consequently output pins can have eight product terms, twelve product terms or sixteen product terms. It is not possible to provide a uniform eight product terms to each macrocell. If all thirty-two product terms are utilized and eight product terms are required, the closest that uniformity can be approached is by utilizing only every other macrocell as illustrated in FIG. 2C.

If it is necessary for two adjacent pins to have eight product terms and to utilize all thirty-two product terms, only certain macrocells can be utilized. FIGS. 2C to 2E illustrate possible combinations where two adjacent pins have eight product terms and all thirty-two product terms are utilized. It is possible to have three adjacent pins with eight product terms each only by using macrocells R3 to R5 (FIG. 2F). It is not possible to have four adjacent output pins with eight product terms each.

FIGS. 2G and 2I illustrate some possible configurations with twelve product terms. It is not possible to have two adjacent macrocells with twelve product terms.

To utilize all thirty-two product terms, and have sixteen product terms at the output pins, only output pins 2 and 6 (FIG. 2J) can be utilized because only these output pins can receive sixteen product terms. This is the only combination allowed. While the steering of product-term clusters is an improvement (better silicon efficiency, and faster speed) over the fixed variable distribution PAL devices, the lack of uniformity of greater than four product terms and the limited number of output pins that can receive the maximum number of product terms lead to the problems described above.

In the next generation of programmable logic devices as disclosed in the copending and commonly assigned U.S. patent application, Ser. No. 07/924,685, entitled "Architecture Of A Multiple Array High Density Programmable Logic Device With A Plurality Of Programmable Switch Matrices", of Om P. Agrawal et al., filed on Aug. 3, 1992, which is incorporated herein by reference in its entirety, additional logic allocation resources were provided and the number of product terms deepened. Specifically, the output terminal of each router element in logic allocator 315 still was connected to four product-term clusters, but the number of product terms per cluster was increased and an output switch matrix 340 was added to increase the product-term routing flexibility to the I/O pins.

The operation of logic allocator 315 is illustrated in FIG. 3. Boxes L0 through L15 on the left-hand side of the figure, each of which contains the numeral "5", represent five product-term clusters in PAL structure 310. On the right-hand side of FIG. 3 are boxes BC0 through BC15 where each box represents logic that couples an output signal of logic allocator 315 to output switch matrix 340. The number within boxes BC0 to BC15 is the maximum number of product terms that logic allocator 315 can route to that logic macrocell. Each line within logic allocator 315 represents a router element, and the numbers on a line within logic allocator 315 represent the product-term clusters, as numbered on the left-hand side of the figure, that can be steered to a logic macrocell by the router element. Thus, in this PLD, the output terminal of the router element also is programmably connectable to a maximum of four product-term clusters.

Again, no product-term resources were permanently allocated to a specific logic macrocell or to a specific I/O pin by logic allocator 315. In another embodiment(not shown), PAL structure 310 includes an additional fifteen product terms over those described above. These additional product terms provide full wrap-around emulation so that in this embodiment, the logic allocator provides up to twenty product terms to each logic macrocell.

In FIG. 3, output switch matrix bank 340 programmably steers the output signal from a particular logic macrocell to a particular I/O pin. This capability enhances the symmetry of a programmable logic block at the I/O pins without adding additional product terms.

Specifically, logic allocator 315, as shown in FIG. 3, does not support complete wrap-around. In prior art PLDs with a logic allocator that did not support complete wrap-around as in FIG. 1, some I/O pins had access to a smaller number of product terms than other I/O pins. Thus, as shown above, some I/O pins had a programmably fixed and different range of logic capability than the programmably fixed range of logic capability for other I/O pins.

However, output switch matrix bank 340 steers signals from logic macrocells BC0 to BC15 to I/O pins so that a group of I/O pins may be configured to have the same logic capability independent of the relationship of the I/O pin to a logic macrocell that has a lesser logic capability. Hence, to the user application, the PLD appears to have better symmetry than the prior art PLDs because no I/O pin has a fixed logic capability.

Output switch matrix 340 partially compensates for non-uniform logic allocator 315 and aids in maintaining pin-out with logic design changes. Specifically, the output signal from a particular macrocell could be routed to a subset of the I/O pins of the logic block and so it was easier to route a particular macrocell output signal to a particular pin. This significantly assisted in maintaining the pin-out with logic designs by improving the amount of logic associated with an I/O pin.

However, while this eased the design change problem, the basic non-uniform product-term distribution remained. Output switch matrix 340 did not improve the logic associated with the macrocell. The amount of logic associated with the macrocell is limited by the flexibility of logic allocator 315. The maximum amount of logic associated with a macrocell determines the feedback capability. If a macrocell is allowed to have only up to twenty product terms, the maximum amount of feedback from the macrocell is also restricted to be twenty product terms. For complex state machines, if a macrocell needs more product terms than the twenty product terms, logic has to be fedback via the centralized switch matrix which results in increased delay.

Output switch matrix 340 also introduces some additional signal time delay. This time delay is on top of the time delay associated with logic allocator 315. Thus, a signal traversing from pin to pin incurs two delays, a logic allocator time delay plus the output switch matrix time delay.

While the logic allocators in FIGS. 1 and 3 are a great improvement over the fixed, variable distribution PLDs, a new logic allocation method and structure are needed that provides logic efficiency with a minimum number of fixed resources for very high-density PLDs. Preferably, the new structure would minimize the speed delays and would not require too much silicon area.

SUMMARY OF THE INVENTION

A programmable uniform distribution logic allocator of this invention overcomes the shortcomings of the prior art logic allocators and enhances the speed, silicon utilization, logic efficiency, logic utilization, and scalability of very high-density complex programmable logic devices (CPLDs) that use the new logic allocator. The programmable uniform distribution logic allocator provides programmable access to a uniform and symmetrical maximum number of product terms to each I/O pin of the CPLD and the same uniform maximum number of product terms as feedback. However, no product terms are permanently connected to either a particular macrocell or a particular I/O pin.

According to the principles of this invention, the total number of product terms programmably available to each logic macrocell in the programmable logic block is the same, i.e., the product-term allocation is uniform and variable. In one embodiment, the number of product terms that can be programmably steered by the programmable uniform distribution logic allocator, i.e. the number of product terms available, to a logic macrocell and consequently an I/O pin ranges from zero to the total number of product terms dedicated to logic in a programmable logic block. Thus, the product-term distribution is symmetrical, uniform, and variable. In another embodiment, each logic macrocell, each I/O pin, and each logic macrocell feedback line has available zero to one-half the total number of product terms dedicated to logic in a programmable logic block and so the product-term distribution is uniform and variable.

The uniform and variable logic product-term cluster distribution of the programmable uniform distribution logic allocator of this invention provides several major benefits. First, the need for "wrap-around" at the boundaries of the programmable logic array for better product-term allocation has been obviated. Second, the need for an output switch matrix between the logic macrocells and the I/O cells to obtain a uniform distribution at the I/O pins also has been obviated. Third, the logic depth is increased up to thirty-two product terms with no feedback needed, i.e., up to thirty-two product terms are available in a single pass through the PLD. The programmable uniform distribution logic allocator achieves the flexibility of optimal routability of logic product-term clusters to I/O pins which allows retaining a prior pin-out while changing a logic design. In addition, the maximum number of logic product terms can be routed to a particular logic macrocell without any additional speed penalty. This allows complete shuffling of the logic mapped on the PLD with the ability to retain prior pin-outs and removes any dependencies of product-term clusters between adjacent macrocells.

In one application, the programmable uniform distribution logic allocator includes a multiplicity of router elements where each router element steers a sum of a selected number of sum-of-product terms from a PAL structure, i.e. a selected number of logic product-term clusters, to a programmably selected logic macrocell. Herein, a logic macrocell is representative of logic in the CPLD that utilizes the logic product terms.

Specifically, the programmable uniform distribution logic allocator has a plurality of input lines, a plurality of output lines and a plurality of programmable router elements. Each programmable router element has an output terminal connected to an output line in the plurality of logic allocator output lines. Also, each programmable router element programmably couples and decouples each of the logic allocator input lines to the router element output terminal so that each logic allocator output line has access to all input signals on the plurality of logic allocator input lines. Upon coupling a logic allocator input line to a router element output terminal, the input line is decoupled from all other router element output terminals in the logic allocator.

In this embodiment, each programmable router element includes a programmable demultiplexer having an input terminal connected to an input line in the plurality of logic allocator input lines, and a plurality of output terminals. The input terminal is programmably connectable to and disconnectable from the plurality of output terminals, and upon programmably connecting the input terminal to one of the plurality of output terminals, the input terminal is disconnected from all other output terminals in the plurality of output terminals The programmable router element also includes a logic gate having a plurality of input terminals, and an output terminal. Each logic gate input terminal is connected to an output terminal of a different programmable demultiplexer.

In one embodiment, the programmable router element further includes an exclusive-OR gate having an input terminal connected to the output terminal of the logic gate, and an output terminal connected to one of the plurality of logic allocator output lines.

In one application each of pluralities is the same and in another embodiment, the plurality of input lines is twice the size of each of the other pluralities.

Thus, in an integrated circuit, a programmable uniform distribution logic allocator, according to the principle of this invention, includes a plurality of input lines and a plurality of N output lines where N is an integer. The programmable uniform distribution logic allocator also includes a plurality of logic gates. Each logic gate in the plurality of logic gates includes a plurality of N input terminals and an output terminal. Each logic gate has the output terminal coupled to a different output line in the plurality of N output lines of the programmable uniform distribution logic allocator.

The programmable uniform distribution logic allocator also includes a plurality of programmable demultiplexers. Each programmable demultiplexer includes an input terminal connected to an input line in the plurality of input lines of the programmable uniform distribution logic allocator and a plurality of N output terminals. Each output terminal in the plurality of N output terminals is connected to an input terminal of a different logic gate in the plurality of logic gates so that each output line of the programmable uniform distribution logic allocator has access to signals on N input lines in the plurality of input lines. The input terminal of a programmable demultiplexer is programmably connectable to and disconnectable from the plurality of N output terminals and upon programmably connecting the input terminal to one of the plurality of N output terminals, the input terminal is disconnected from all other output terminals in the plurality of N output terminals.

In one embodiment, the plurality of N output lines comprises eight output lines and the number of input lines to the programmable uniform distribution logic allocator is the same as the number of output lines. In another embodiment, the plurality of input lines is greater than the plurality of output lines.

DETAILED DESCRIPTION

Unlike prior art logic allocators that either had shared input signals, had non-uniform distribution of output signals with a maximum of sixteen or less product terms per I/O pin, or had non-uniform distribution of output signals with a maximum of twenty or less product terms per I/O pin and were used with an output switch matrix, a programmable uniform distribution logic allocator of this invention maintains the speed and isolation advantages of the prior art logic allocators while improving logic flexibility and efficiency, and minimizing the problems associated with retaining pin-outs for logic changes, the time delays, and the silicon die size. In one embodiment, a programmable uniform distribution logic allocator of this invention receives N input signals. Each of the N input signals is programmably connectable to and disconnectable from each of N output lines of the programmable uniform distribution logic allocator. Further, each output line of the programmable uniform distribution logic allocator can be configured to receive from zero to all N of the input signals. When an input signal is routed to a particular output line, the input signal is not available to any to the remaining output lines, i.e., an input signal is not shared among output lines.

Figure 1:
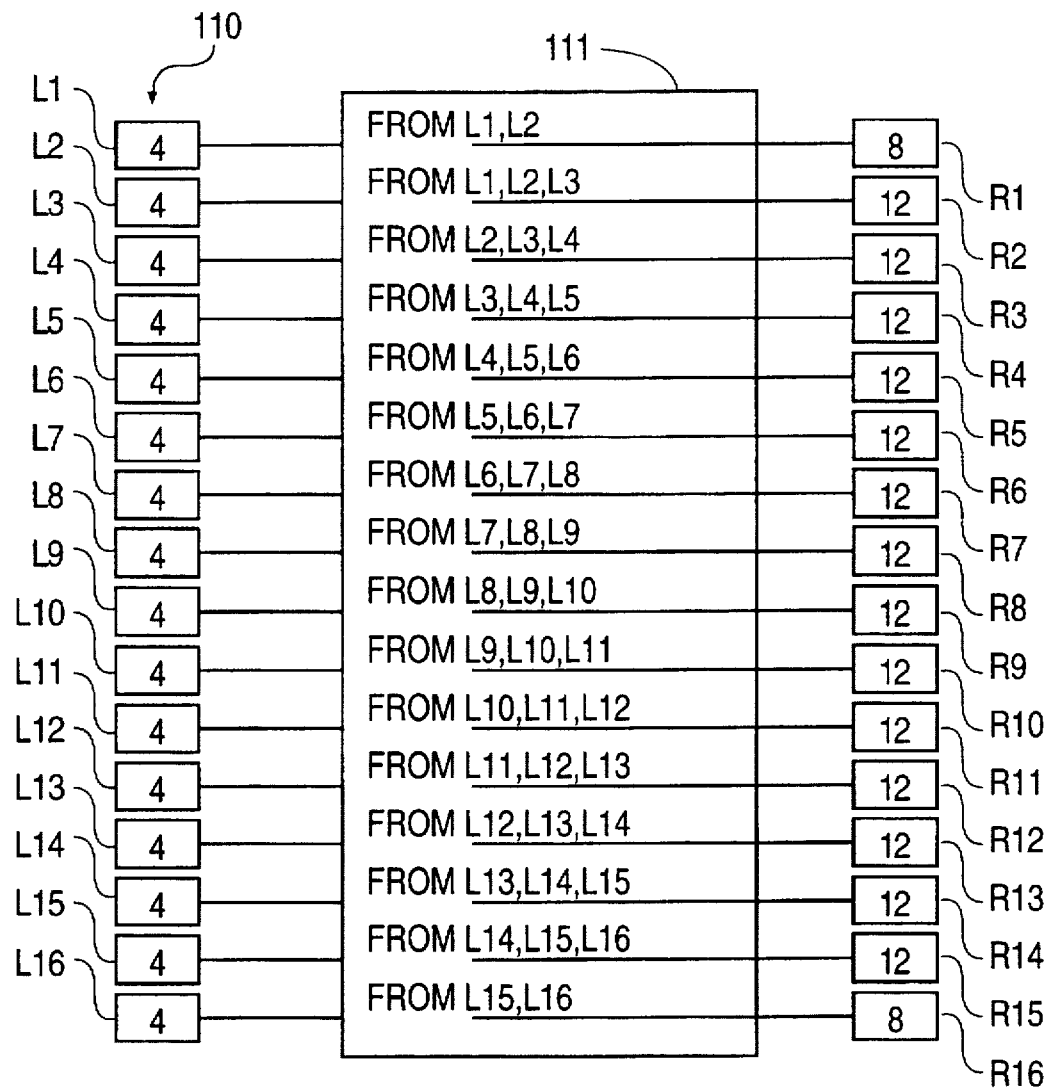
FIG. 1 is a representation of a first-generation PLD that include a logic allocator.
Figure 2A:
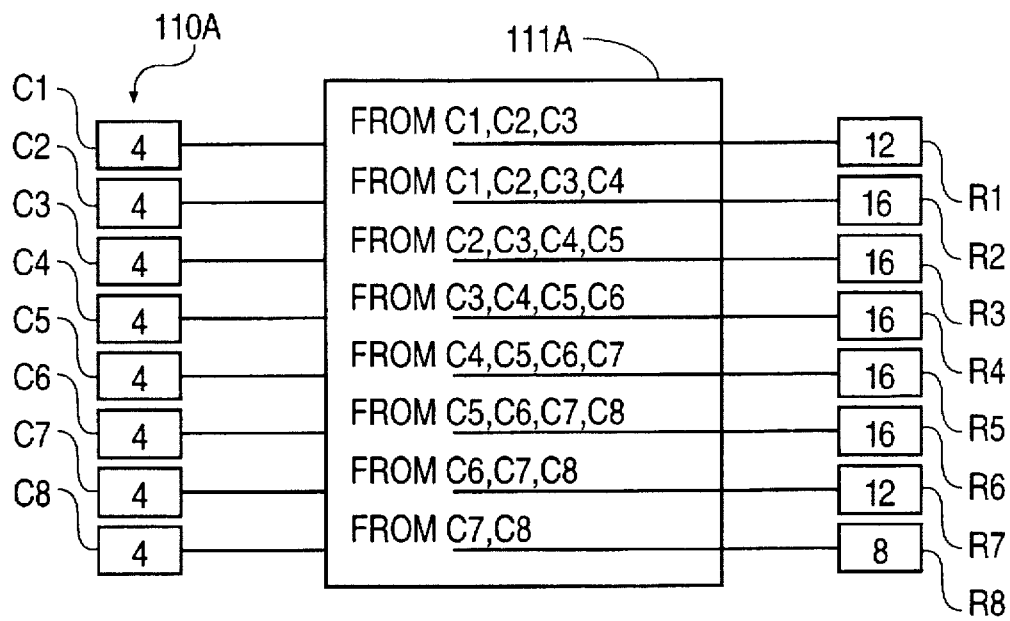
FIG. 2A is a representation of the first-generation PLD with a logic allocator for a logic block including eight macrocells.
Figure 2B:
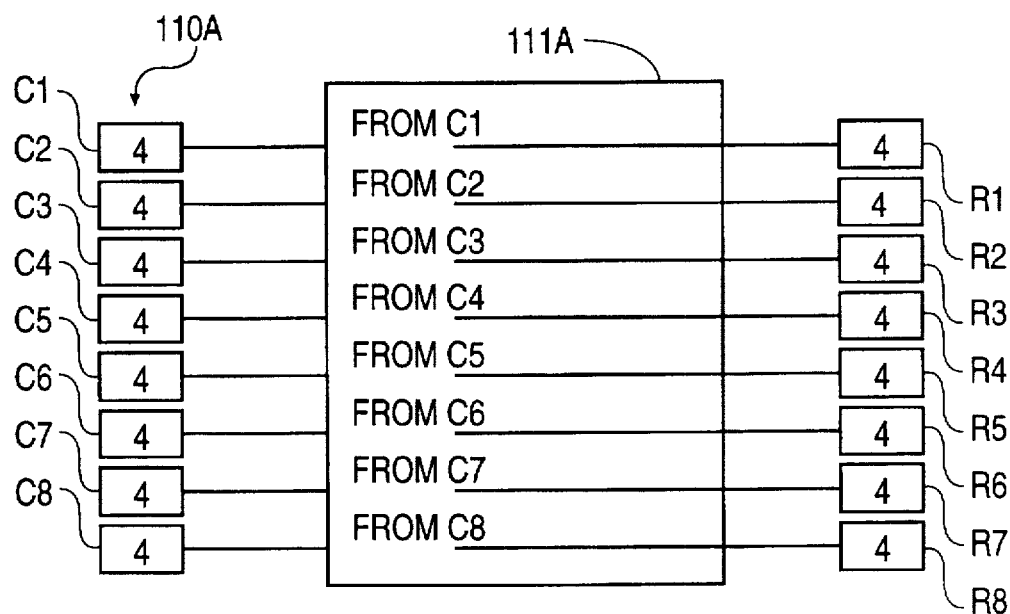
FIGS. 2B to 2J illustrate alternative product-term distributions upon programming the logic allocator of FIG. 2A.
Figure 2C:
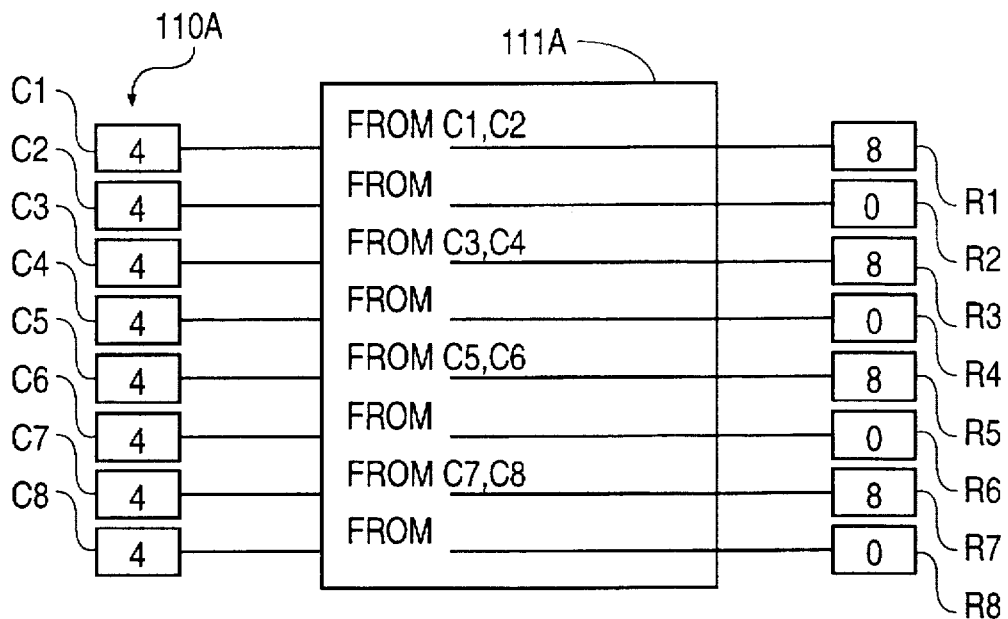
Figure 2D:
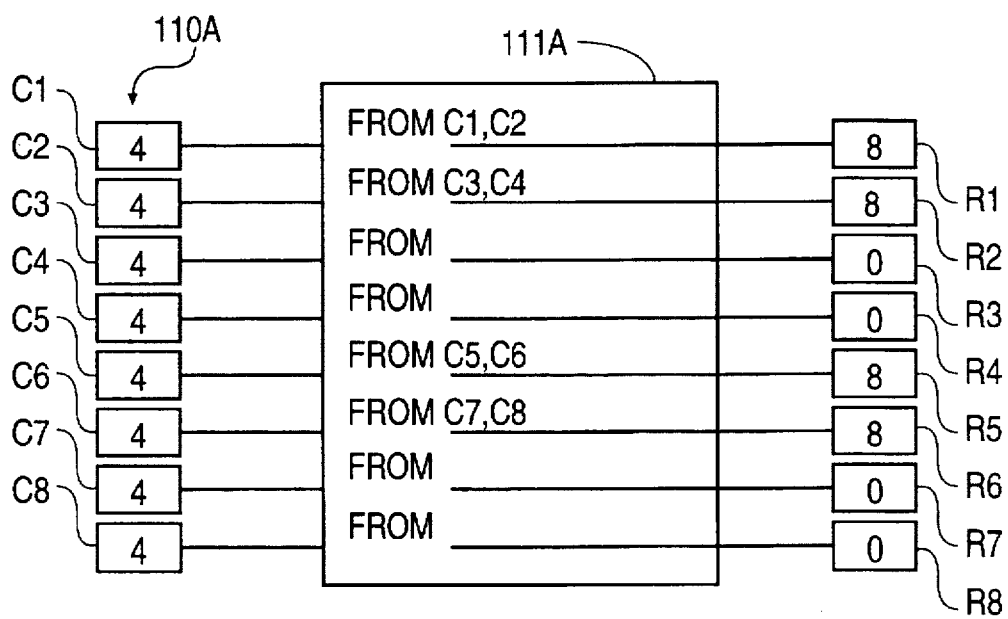
Figure 2E:
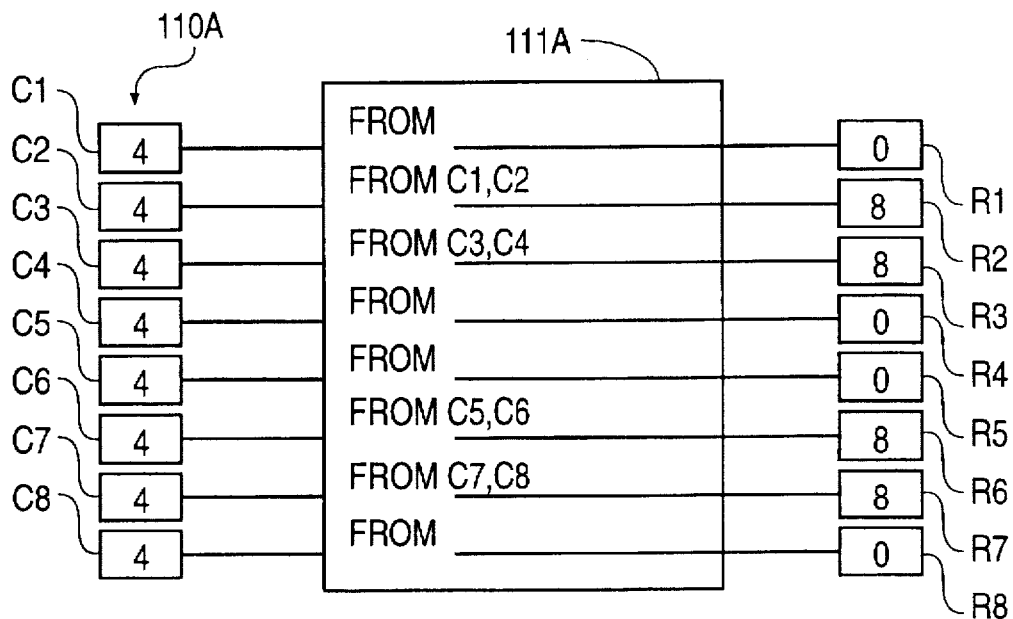
Figure 2F:
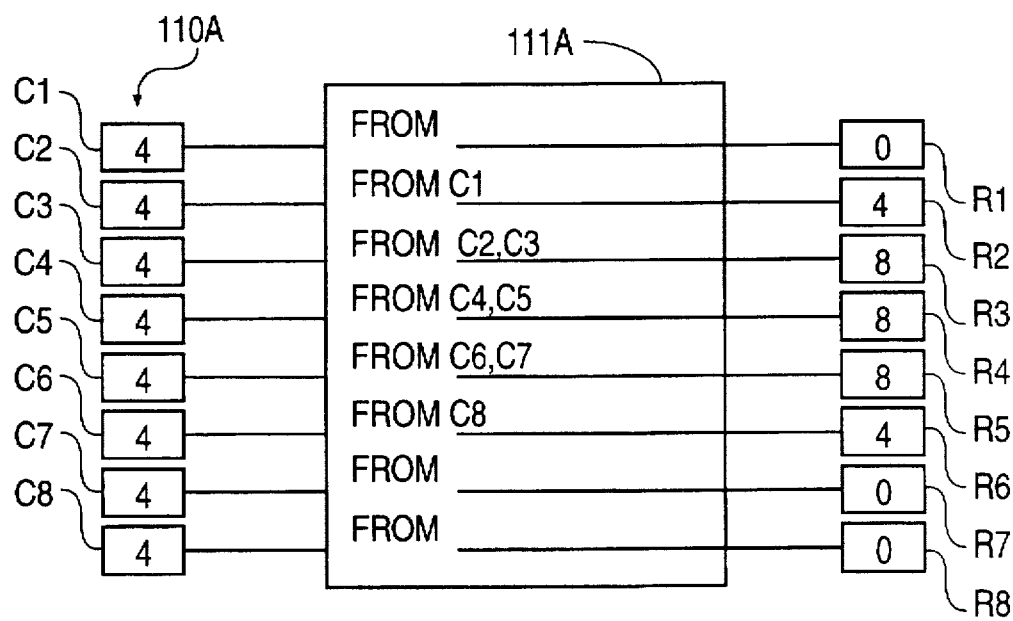
Figure 2G:
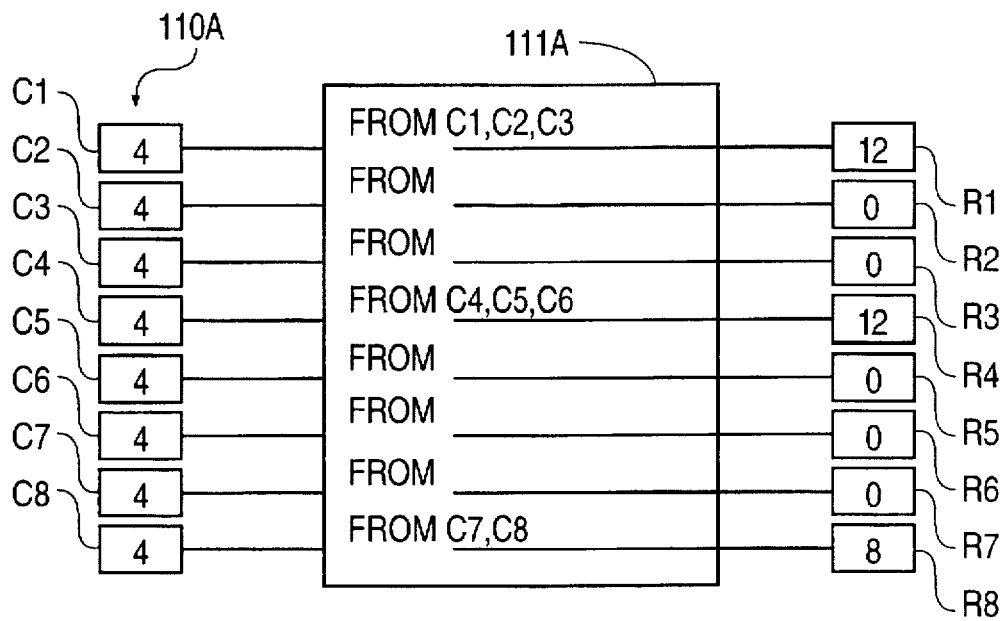
Figure 2H:
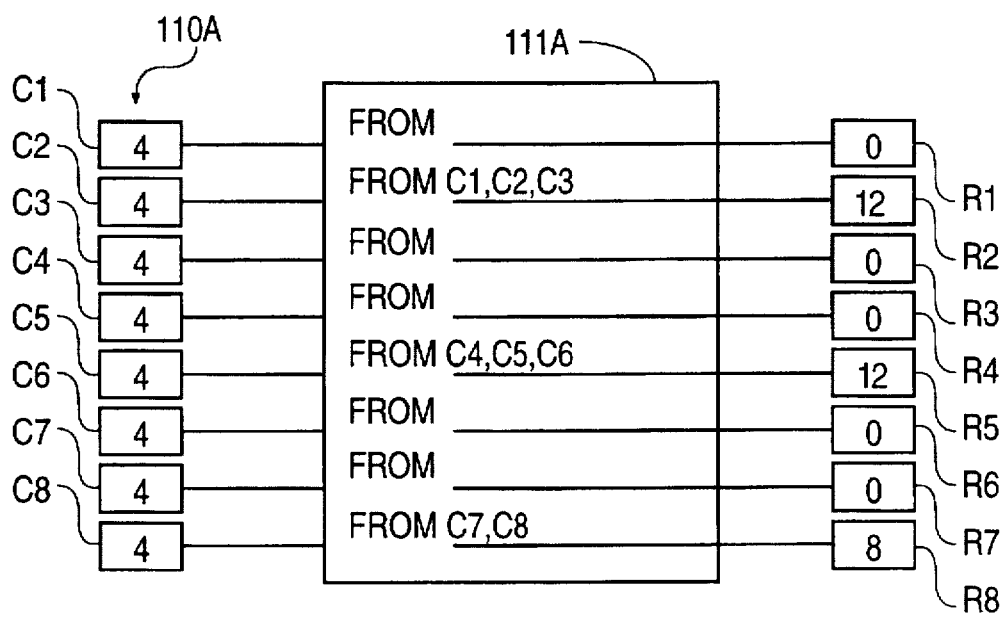
Figure 2I:
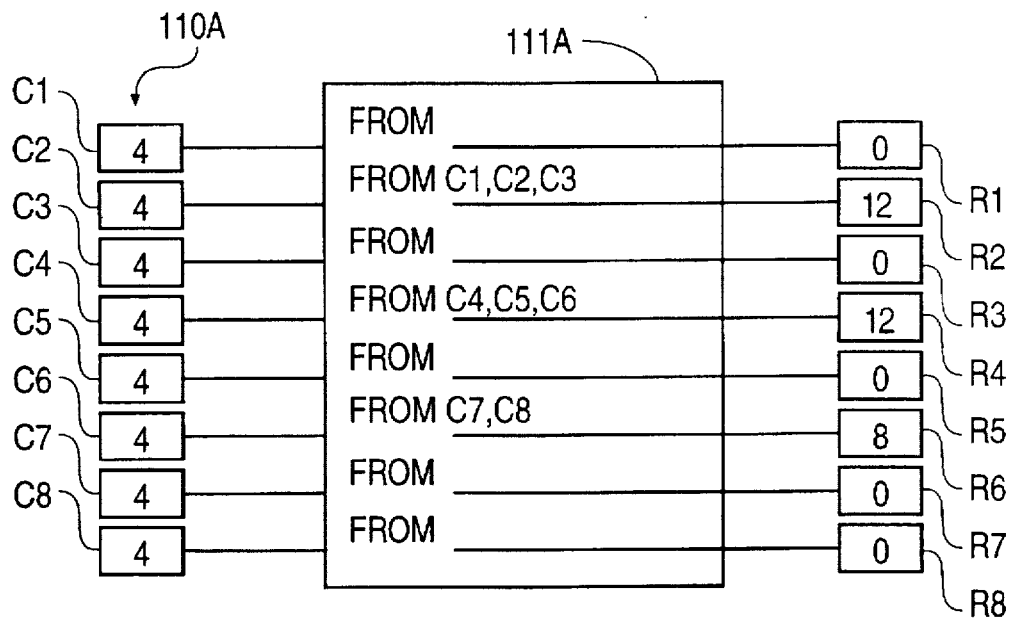
Figure 2J:
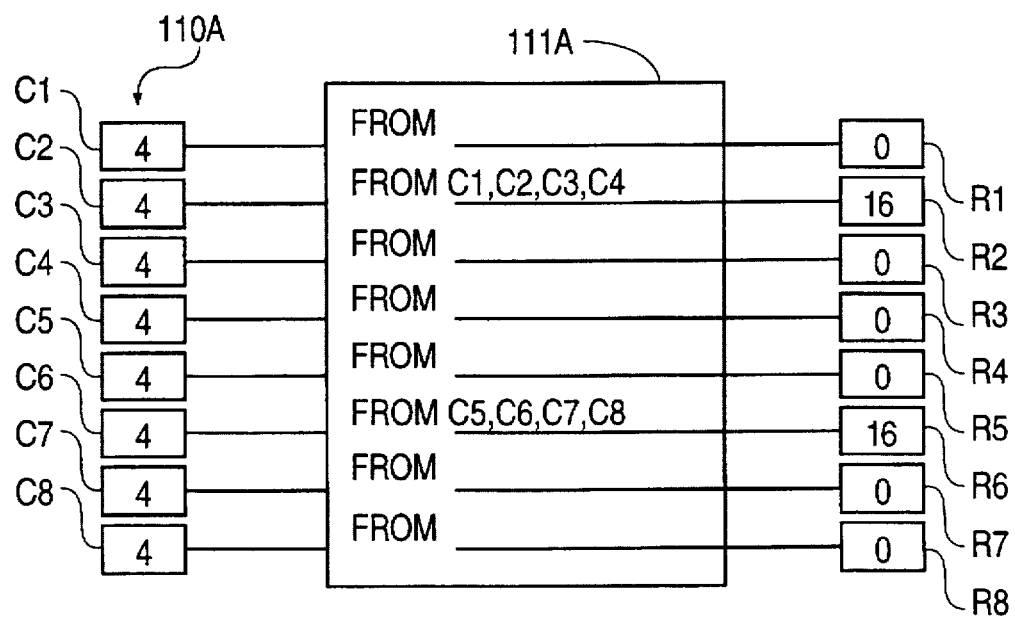
Figure 3:
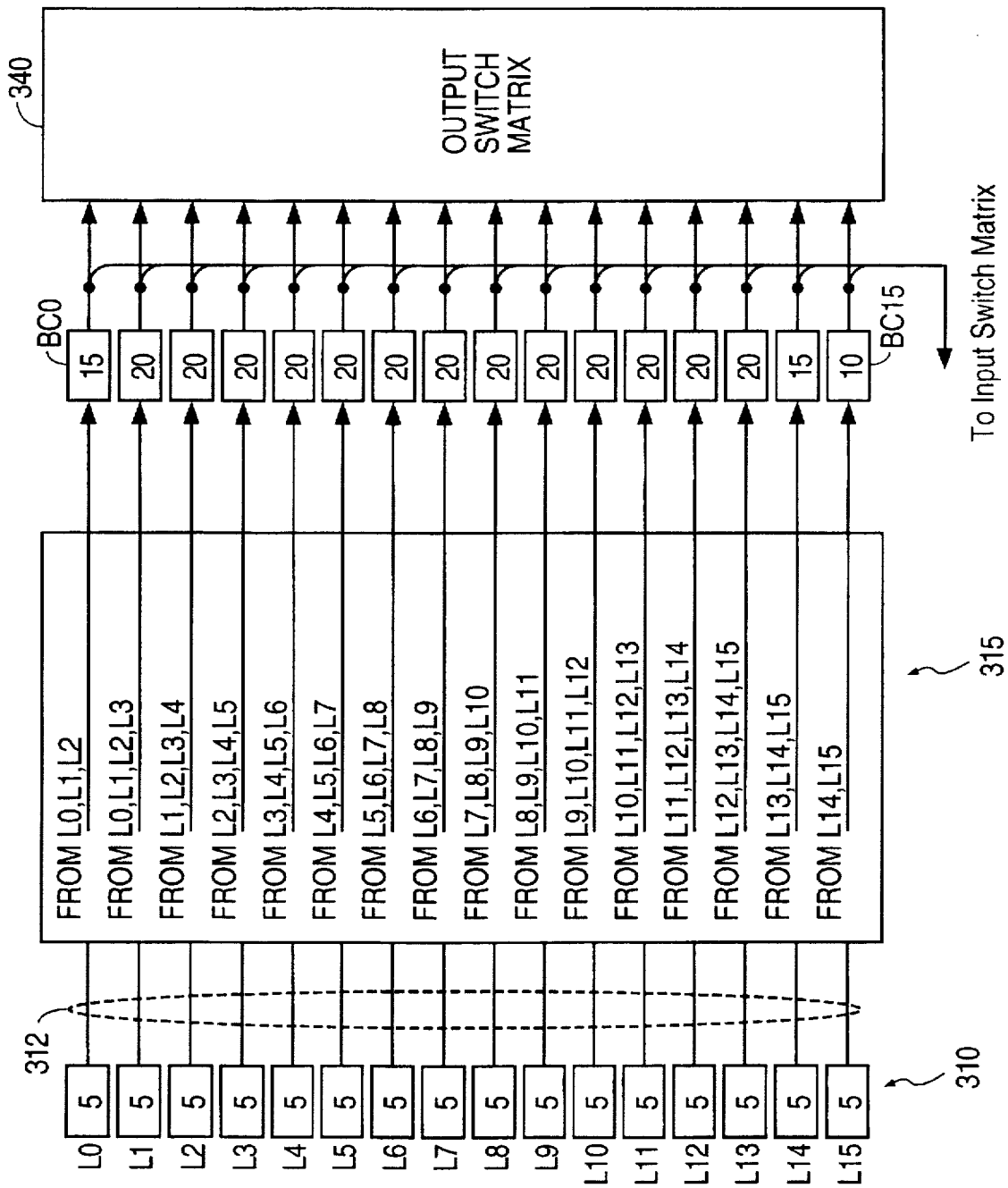
FIG. 3 is a representation of a second generation PLD that included a logic allocator.
Figure 4:
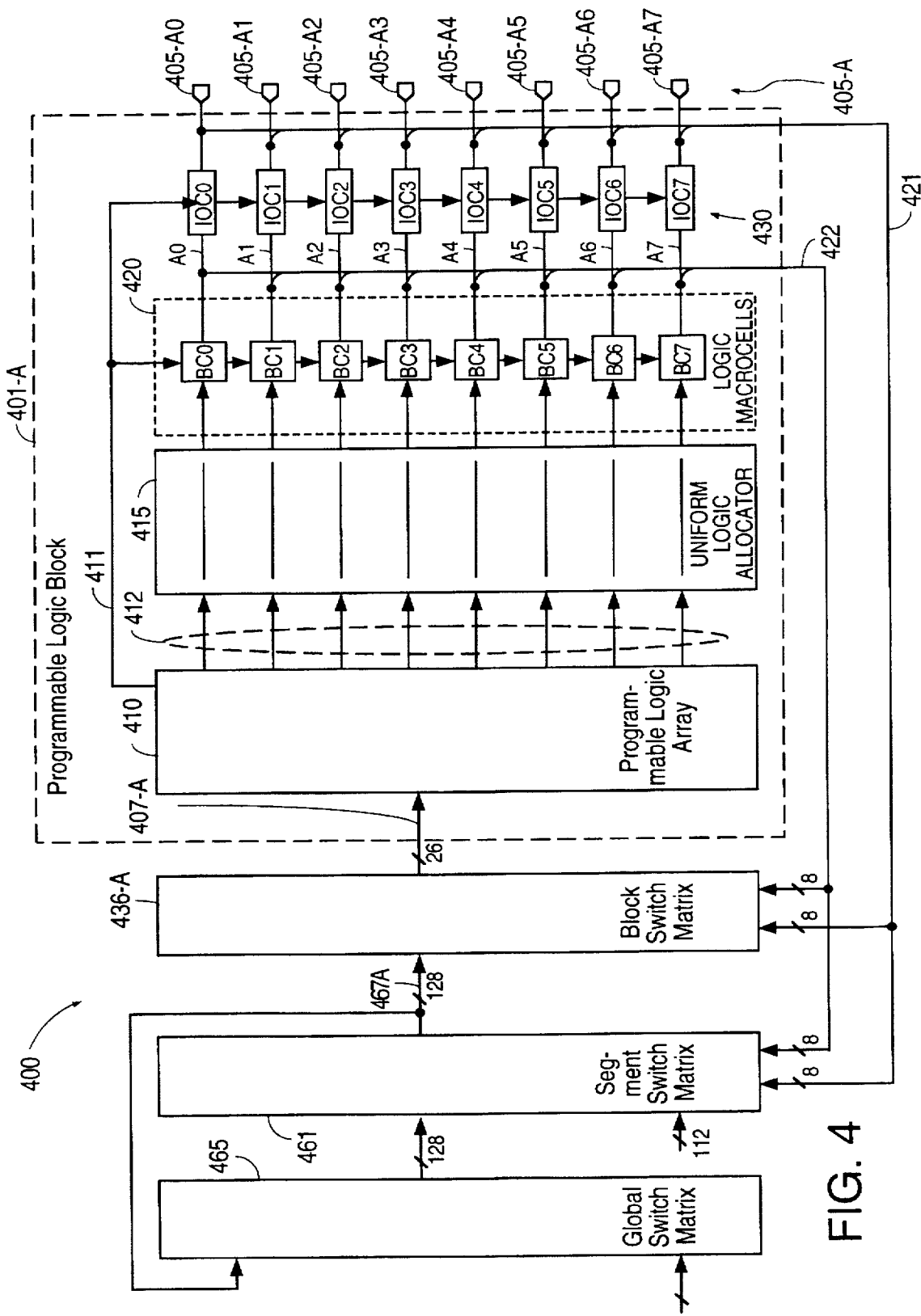
FIG. 4 is a block diagram of a first programmable logic device that includes the programmable uniform distribution logic allocator of this invention.

FIG. 4 is a detailed block diagram of one embodiment of a CPLD architecture that includes programmable uniform distribution logic allocator 415 of this invention. In this embodiment, a very high-density CPLD 400 includes a plurality of programmable logic blocks and each programmable logic block in CPLD 400 is similar to programmable logic block 401-A. Programmable logic block 401-A receives input signals over input lines 407-A from a block switch matrix 463-A.

Block switch matrix 463-A is part of a hierarchical switch matrix that also includes segment switch matrix 461 and global switch matrix 465. CPLD 400 is divided into segments where a segment includes two or more programmable logic blocks and in this embodiment, eight programmable logic blocks so that each segment has sixty-four macrocells and sixty-four I/O pins. Preferably, each segment includes the same number of programmable logic blocks.

Programmable logic blocks within a segment communicate with each other through the segment switch matrix. Thus, in FIG. 4, segment switch matrix 461 has a predetermined number of input lines, e.g., 128 input lines, from global switch matrix 465; a predetermined number of local feedback lines, e.g., sixteen feedback lines 422 and 421; and yet another predetermined number of input lines, e.g., 112 input lines, from other programmable logic blocks within the segment that includes programmable logic block 401-A.

Segments within CPLD 400 communicate with each other through global switch matrix 465. A more detailed description of the hierarchical switch matrix is given in copending, commonly assigned, and commonly filed U.S. patent application No. 08/459,230, entitled "A MULTI-TIERED HIERARCHICAL HIGH SPEED SWITCH MATRIX STRUCTURE FOR VERY HIGH-DENSITY COMPLEX PROGRAMMABLE LOGIC DEVICES," of Om P. Agrawal et. al. filed on Jun. 2, 1995.

The particular configuration of the hierarchical switch matrix is not of importance to this invention. Programmable uniform distribution logic allocator 415 can be utilized in a wide range of CPLDs in addition to those that include a hierarchical switch matrix.

Programmable logic block 401-A includes a programmable logic array 410, a programmable uniform distribution logic allocator 415, and a plurality of programmable logic macrocells 420 that includes macrocells BC0 to BC7. I/O cells 430 include a plurality of I/O cells IOC0 to IOC7 and I/O pins 405-A include I/O pins 405-A0 to 405-A7.

In one embodiment, programmable logic array 410 is a programmable-AND fixed-OR logic array(AND/OR array), i.e. a PAL structure. While PAL structure 410 is described herein in terms of an AND/OR array, the AND/OR array is implemented in one embodiment as NOR/NOR logic with NAND/NAND arrays that are functionally equivalent to the AND/OR arrays described herein. Accordingly, the use of AND/OR array logic is illustrative only and is not intended to limit the scope of the invention.

Programmable logic block input lines 407-A from block switch matrix 463-A provide the input signals to a programmable-AND array in PAL structure 410. In one embodiment, each input signal and its complement are provided to the programmable-AND array so that the programmable-AND array has a total of fifty-two input lines. The programmable-AND array in PAL structure 110 has thirty-two product terms for logic and a plurality of product terms for control.

Each cluster of four product terms drives one OR gate in the fixed-OR gate array of PAL structure 410. In one embodiment, three of the product terms are fixedly connected to the OR gate and one of the product terms is programmably connectable to and disconnectable from the OR gate. In another embodiment, all of the product terms are fixedly connected to the OR gate. The sum-of-product terms from an OR gate drives one input line in eight input lines 412 of programmable uniform distribution logic allocator 415.

Programmable uniform distribution logic allocator 415 is programmable so that sums of product terms from PAL structure 410 are distributed to logic macrocells BC0 to BC7 as required by the user of the CPLD of this invention. As explained more completely below, programmable uniform distribution logic allocator 415 includes a multiplicity of router elements, that are represented by the horizontal lines within logic allocator 415, where each router element steers a sum of a selected number of sum-of-product terms from PAL structure 410, i.e. a selected number of logic product-term clusters, to a programmably selected logic macrocell. Further, the router elements are configured to optimize the logic efficiency.

In this embodiment, the number of product terms programmably available to a logic macrocell, and consequently an I/O pin, from each router element ranges from zero to the total number of product terms dedicated to logic in programmable logic block 401-A. According to the principles of this invention, the total number of product terms programmably available to each logic macrocell in the programmable logic block is the same, i.e., the product-term allocation is uniform, symmetrical, and variable for each logic macrocell.

Unlike the prior art CPLDs that required a logic allocator and an output switch matrix to create a symmetrical appearance at the I/O pins, programmable uniform distribution logic allocator 415 provides a uniform, symmetrical distribution of product terms to the I/O pins without an output switch matrix. Further, the feedback signals from the macrocells on lines 422 are uniform and symmetrical.

The uniform and variable logic product-term cluster distribution of programmable uniform distribution logic allocator 415 provides several major benefits. First, the need for "wrap-around" at the boundaries of the programmable logic array for better product-term allocation has been obviated. Second, the need for an output switch matrix between the logic macrocells and the I/O cells also has been obviated. Third, the logic depth is increased up to thirty-two product terms with no feedback needed, i.e., up to thirty-two product terms are available in a single pass through the CPLD.

Programmable uniform distribution logic allocator 415 achieves the flexibility of optimal routability of logic product-term clusters to I/O pins which allows retaining a prior pin-out while changing a logic design. In addition, the maximum number of logic product terms can be routed to a particular logic macrocell without any additional speed penalty. This allows complete shuffling of the logic mapped on the CPLD with the ability to retain prior pin-outs and removes any dependencies of product-term clusters between adjacent macrocells.

The number of product-term clusters per router element may be selected in numerous ways. In this embodiment, the selected number of product terms per product-term cluster is preferably three or four and there is one router element in programmable uniform distribution logic allocator 415 for each logic macrocell BC0 to BC7. However, no router element is permanently connected to a product term cluster. Programmable uniform distribution logic allocator 415 programmably couples and decouples PAL structure 410 from logic macrocells BC0 to BC7.

Figure 5A:
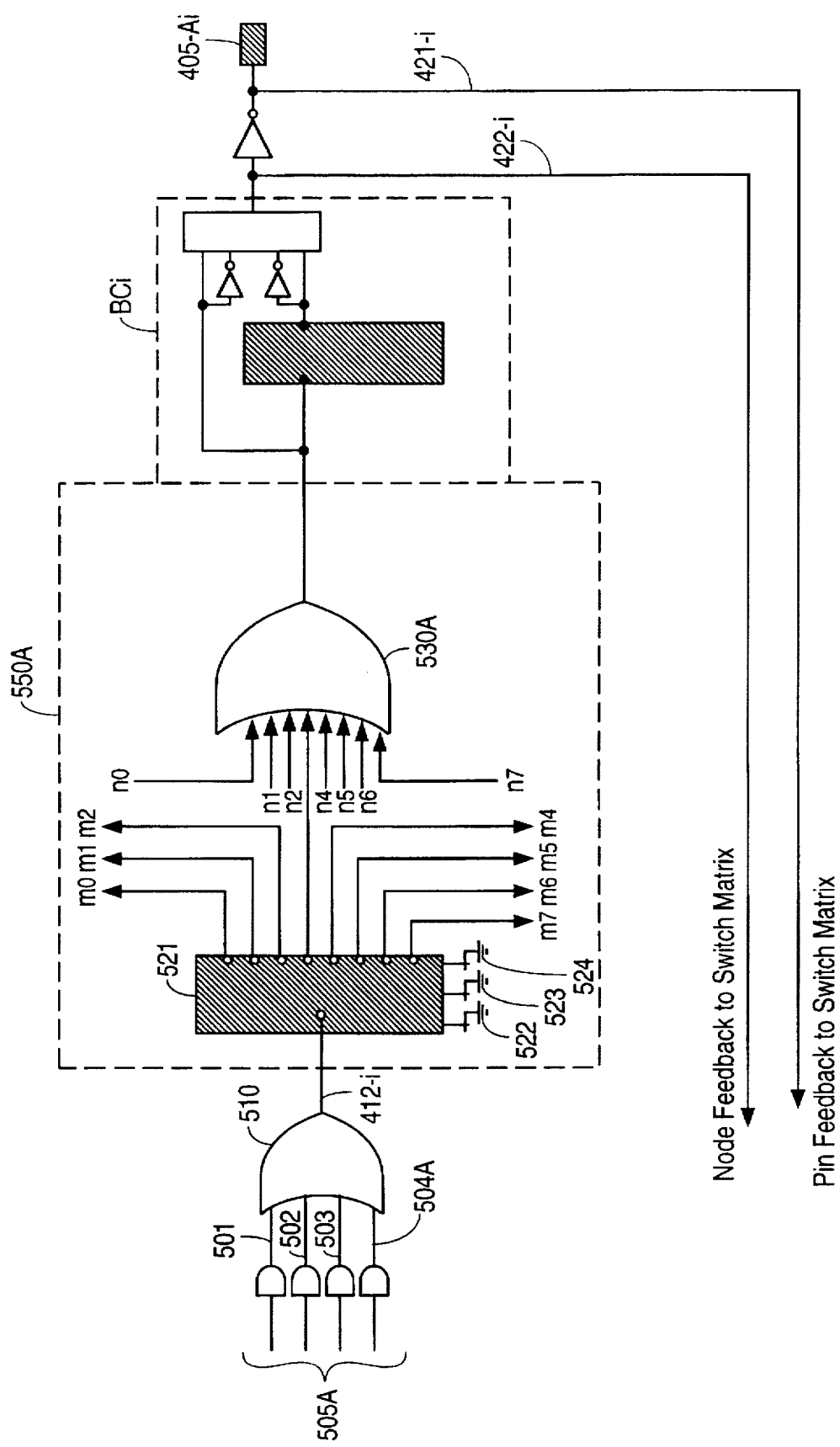
FIG. 5A is a representation of a first embodiment of a typical router element in the various embodiments of the programmable uniform distribution logic allocator of this invention.

FIG. 5A is a schematic of a typical router element 550A in a first embodiment of programmable uniform distribution logic allocator 415. A product-term cluster 505A includes four products 501 to 504A that are each fixedly connected to a different input terminal of OR gate 510. Product-term cluster 505A and OR gate 510 are included in programmable logic array 410.

Logic allocator input line 412-i represents one input line in the plurality of input lines 412 of programmable uniform distribution logic allocator 415. Logic allocator input line 412-i connects an output terminal of OR gate 510, e.g., an output terminal of a logic gate, to an input terminal of a programmable demultiplexer 521, that, in this embodiment, is a 1-to-8 programmable demultiplexer. Thus, product-term cluster 505A is connected to the input terminal of programmable demultiplexer 521.

Each output terminal of programmable demultiplexer 521 is connected to an input terminal of a different OR gate within logic allocator 415 so that programmable demultiplexer 521 has an one output terminal connected to one input terminal of eight different OR gates in eight different router elements. Thus, router element 550A is interconnected to seven other router elements by lines m0 to m2 and m4 to m7. For example, the fourth output terminal of programmable demultiplexer 521 is connected to an input terminal of OR gate 530A. The other seven output terminals are connected to input terminals of OR gates in the seven other router elements by lines m0 to m2, and m4 to m7 respectively.

A signal on input line 412-i is programmably connected to one of the output terminals of programmable demultiplexer 521 and programmably disconnected from the remainder of the output terminals by the configuration of architectural cells 522 to 524 respectively. Architectural cells 522 to 524 may be fuses, EPROM cells, EEPROM cells, RAM cells, or CMOS antifuse technology. The architectural cells are a means for providing an output terminal select signal to a programmable demultiplexer so that the programmable demultiplexer passes the input signal therethrough to a specified output terminal.

As described above, OR gate 530A in router element 550A has one input terminal connected to the fourth output terminal of programmable demultiplexer 521. The other seven input lines to OR gate 530A are connected to output terminals of seven programmable demultiplexers by lines n0 to n2 and n4 to n7. In this embodiment, the output terminal of OR gate 530A is connected to an input terminal of a logic macrocell BCi that drives a first feedback line 422-i and is coupled to an I/O pin that drives a second feedback line 421-i.

Unlike prior art logic allocators that also included a demultiplexer and a logic gate, each programmable router element 550A in programmable uniform distribution logic allocator 415 is programmable so that product terms clusters are distributed to any one of logic macrocells BC0 to BC7 as required by the user of the CPLD of this invention, e.g., to OR gate 530A and consequently to logic macrocell BCi. Thus, all of macrocells BC0 to BC7 have programmable access to all of the logic product-term clusters.

In this embodiment, the total number of product terms programmably available to each logic macrocell in the programmable logic block is the same, i.e., the product-term allocation is symmetric, uniform and variable. However, no product-term clusters are permanently connected to an output line of programmable uniform distribution logic allocator 415. The need for wrap-around has been eliminated as has the need for an output switch matrix. Further, router element 550A provides greater flexibility than a non-uniform logic allocator and output switch matrix as described above.

Thus, the major benefits of a programmable uniform distribution logic allocator 415 made up of router elements 550A include: full product-term distribution symmetry; up to thirty-two logic product terms for each macrocell BCi which in turn increases the logic depth; complete shuffling of logic is possible with the ability to retain prior pin-outs; obviation of the need for an output switch matrix; obviation of the need for any product-term wrap-around; removal of any dependencies of clusters between adjacent macrocells; faster speed relative to the combination of a non-uniform logic allocator and an output switch matrix; and ideal for an eight macrocell programmable logic block structure. By allowing up to thirty-two product terms for each macrocell, logic allocator 415 increases the macrocell feedback to thirty-two product terms. This allows a designer to implement up to thirty-two product terms of logic with a single pass of delay.

Figure 5B:
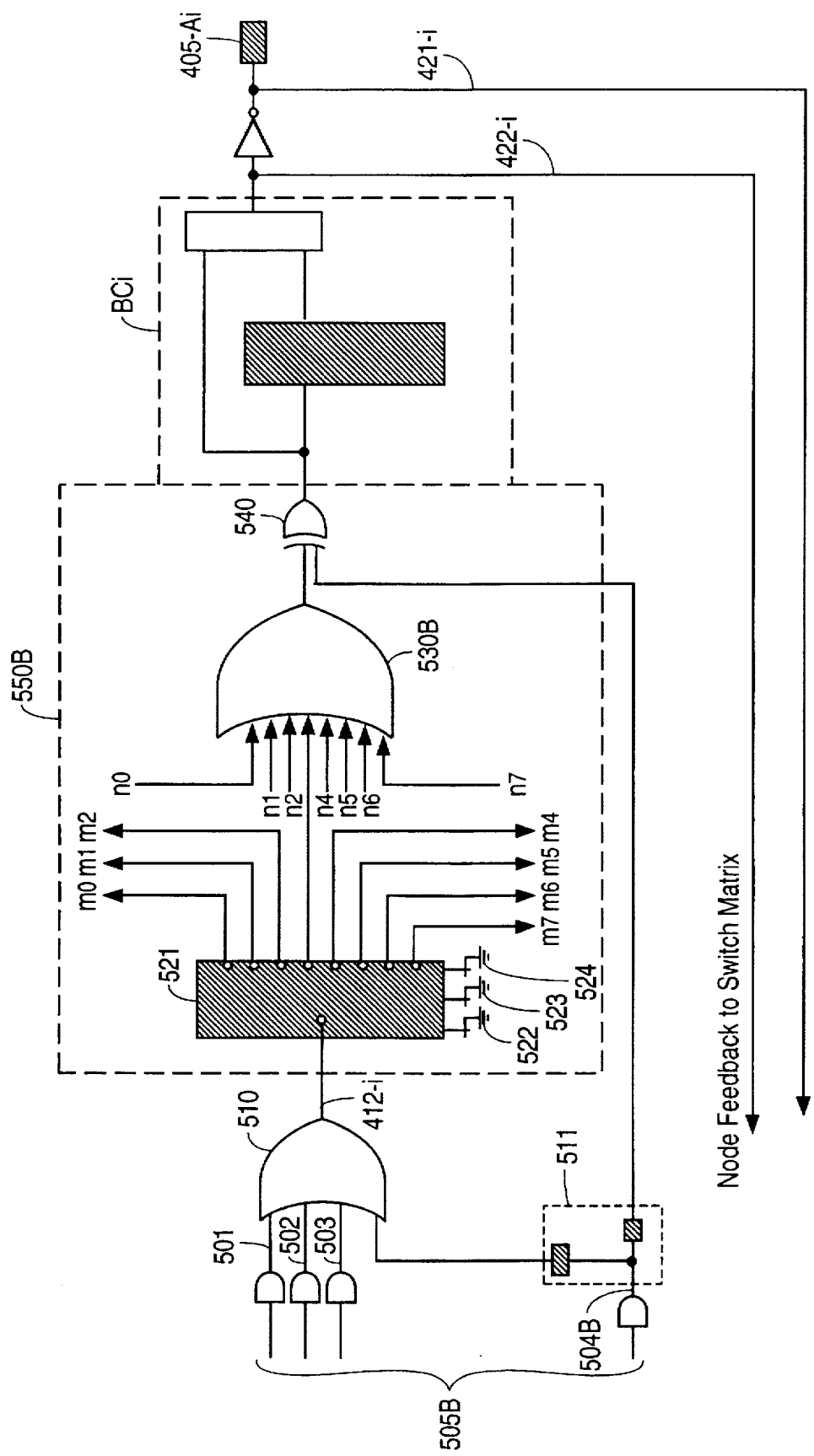
FIG. 5B is a representation of a second embodiment of a typical router element in the various embodiments of the programmable uniform distribution logic allocator of this invention.

FIG. 5B is a schematic of a typical router element 550B in a second embodiment of programmable uniform distribution logic allocator 415. A product-term cluster 505B includes three product terms 501 to 503 that are each fixedly connected to a different input terminal of OR gate 510 and a fourth product-term 504B that is programmably connectable to and disconnectable from OR gate 510 by a programmable connecter 511. Product-term cluster 505B and OR gate 510 are included in another embodiment of programmable logic array 410. FIG. 5D is a more detailed diagram of one embodiment of programmable connecter 511 that includes a programmable two-to-one multiplexer, a programmable signal router, and an exclusive-OR gate.

The interconnections between logic allocator input line 412-i, programmable demultiplexer 521 and the input terminals of OR gate 530B are the same as those described above for input line 412-i, programmable demultiplexer 521, and OR gate 530A and so that description is incorporated herein by reference. In this embodiment, the output terminal of OR gate 530B is connected to a first input terminal of an exclusive-OR gate 540. A second input terminal of exclusive-OR gate 540 is connected to programmable connector 511. An output terminal of exclusive-OR gate drives an input line of a logic macrocell BCi that drives a first feedback line 422-i and is coupled to an I/O pin that drives a second feedback line 421-i. In a first state programmable connector 511 routes product-term 504B to OR gate 510 and in a second state to exclusive-OR gate 540.

Logic allocator 415 made up of router elements 550B utilizes an enhanced product-term cluster 505B, that is split into a three product-term cluster and a one product-term cluster. Single product-term 504B can be steered to allow up to a four product-term cluster if needed. Hence, product-term cluster 505B is a superset of product-term cluster 505A. Thus, logic allocator 415 with router elements 550B includes all of the benefits described above for logic allocator 415 with router elements 550A and that description is incorporated herein by reference.

In addition, since each product-term cluster 505B includes two separate product-term clusters, logic allocator 415 is not forced to steer the whole four product-term cluster to another macrocell. If a macrocell needs a single product-term, the macrocell can use its single product-term and the other three unused product terms can be steered to adjacent macrocells by logic allocator 415 for better logic utilization.

Further, the three-plus-one product-term steering with built-in XOR gate 540 allows macrocell BCi to emulate T or J-K type flip-flops. Also, XOR gate 540 in logic allocator 415 gives built-in polarity control and allows simpler logic macrocells BCi.

In yet another embodiment, (FIG. 5C) router element 550B is utilized in programmable uniform distribution logic allocator 415, but product-term cluster 505C has three AND product terms fixedly connected to OR gate 510 and a NAND product-term programmably connectable to and disconnectable from OR gate 510 and exclusive-OR gate 540.

Figure 6:
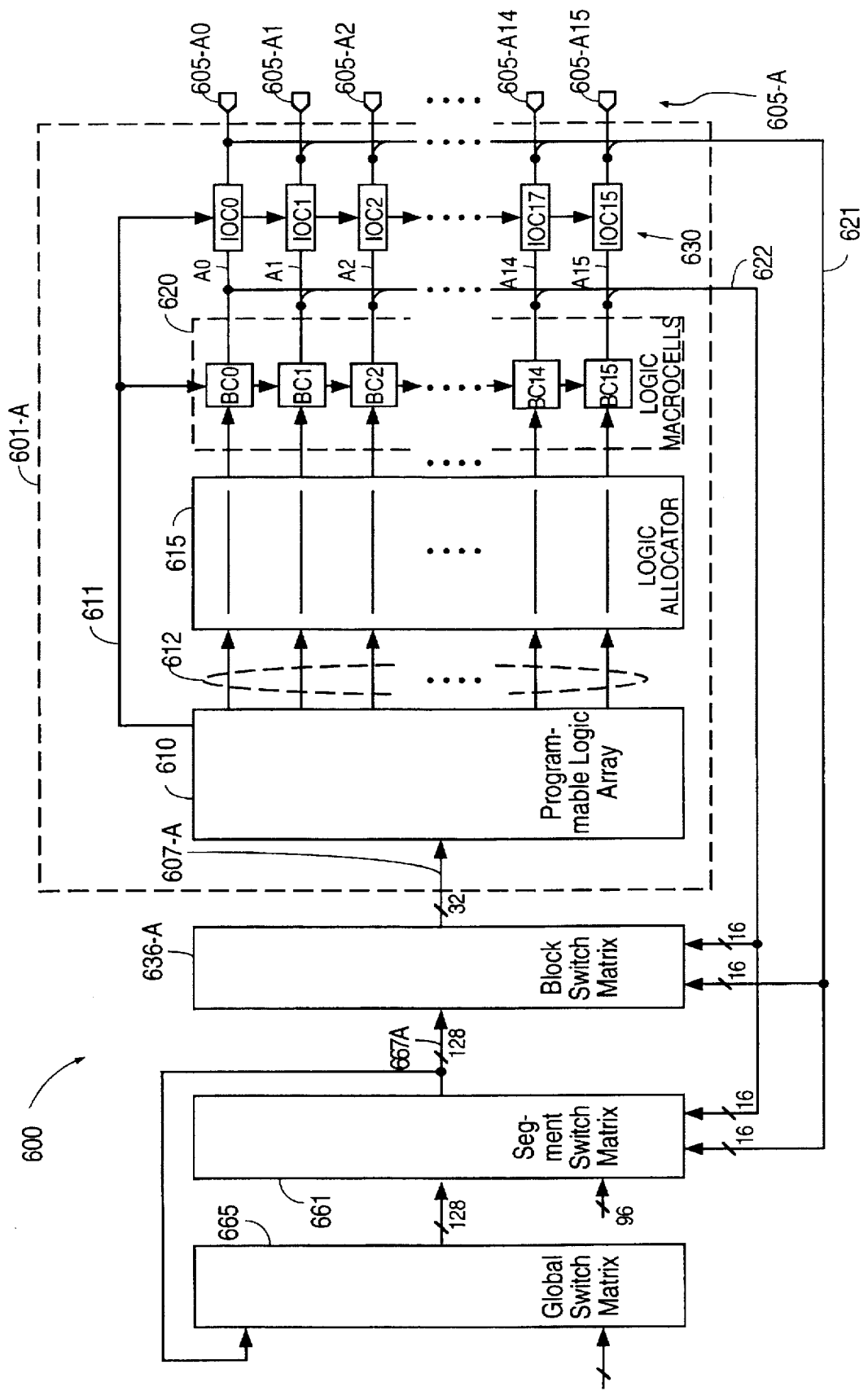
FIG. 6 is a block diagram of a second programmable logic device that includes the programmable uniform distribution logic allocator of this invention.

In the above embodiments, each programmable logic block included eight logic macrocells, but many CPLDs include programmable logic blocks with sixteen logic macrocells. Programmable uniform distribution logic allocator 415 can be used to advantage in such CPLDs. FIG. 6 is a detailed block diagram of one embodiment of a CPLD architecture that includes a programmable uniform distribution logic allocator 615 of this invention that utilizes programmable uniform distribution logic allocator 415. In this embodiment, a very high-density CPLD 600 includes a plurality of programmable logic blocks and each programmable logic block in CPLD 600 is similar to programmable logic block 601-A. The interconnection of programmable logic block 601-A to a hierarchical switch matrix is similar to that described above for programmable logic block 401-A and so is not repeated here. However, in this embodiment, there are four programmable logic blocks per segment and each programmable logic block has thirty-two local feedback lines.

Programmable logic block 601-A includes a programmable logic array 610, a programmable uniform distribution logic allocator 615, and a plurality of programmable logic macrocells 620 that includes macrocells BC0 to BC15. I/O cells 630 include a plurality of I/O cells IOC0 to IOC15 and I/O pins 605-A include I/O pins 605-A0 to 605-A15.

In one embodiment, programmable logic array 610 is a programmable-AND fixed-OR logic array (AND/OR array), i.e. a PAL structure. While PAL structure 610 is described herein in terms of an AND/OR array, the AND/OR array is implemented in one embodiment as NOR/NOR logic with NAND/NAND arrays that are functionally equivalent to the AND/OR arrays described herein. Accordingly, the use of AND/OR array logic is illustrative only and is not intended to limit the scope of the invention.

Programmable logic block input lines 607-A provide the input signals to a programmable-AND array in PAL structure 610. In one embodiment, each input signal and its complement are provided to the programmable-AND array so that the programmable-AND array has sixty-four input lines. The programmable-AND array in PAL structure 610 has a total of sixty-four logic product terms and a plurality of control product terms.

Each cluster of four product terms drives one OR gate in the fixed-OR gate array of PAL structure 610. In one embodiment, three of the product terms are fixedly connected to the OR gate and one of the product terms is programmably connectable to and disconnectable from the OR gate, as described above. The sum-of-product terms from an OR gate drives one input line in sixteen input lines 612 of programmable uniform distribution logic allocator 615.

Programmable uniform distribution logic allocator 615 is programmable so that product terms from PAL structure 610 are distributed to logic macrocells BC0 to BC15 as required by the user of the CPLD of this invention. Programmable uniform distribution logic allocator 615 includes a multiplicity of router elements, as described above, where each router element steers a sum of a selected number of sum-of-product terms from PAL structure 610, i.e. a selected number of logic product-term clusters, to a programmably selected logic macrocell.

In one embodiment, the number of product terms programmably available to a logic macrocell and consequently an I/O pin from the router element ranges from zero to one-half of the total number of product terms dedicated to logic in programmable logic block 601-A. The total number of product terms programmably available to each logic macrocell in the programmable logic block and consequently, each I/O pin, is the same, i.e., the product-term allocation is uniform and variable.

Figure 7A:
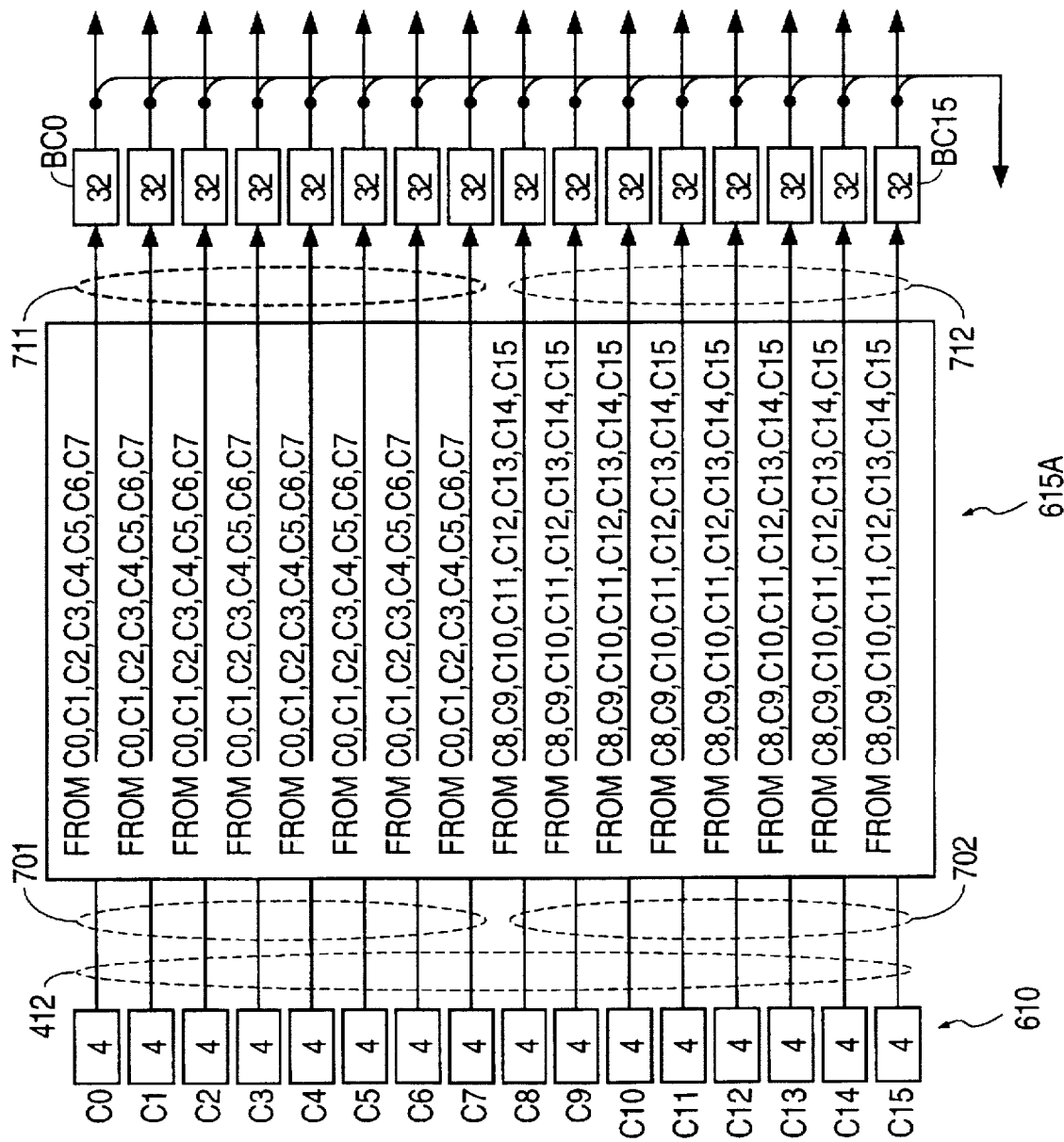
FIG. 7A is a representation of a first embodiment of the programmable uniform distribution logic allocator of this invention that illustrates the interconnection of the router elements and the distribution of product-term clusters to each output line in the CPLD of FIG. 6.

One embodiment of programmable uniform distribution logic allocator 615A is illustrated in FIG. 7A. In FIG. 7A, boxes C0 through C15 on the left-hand side of the figure, each of which contains the numeral "4", represent the product-term clusters in product-term array 610. On the right-hand side of FIG. 7A are sixteen boxes BC0 through BC15 which represent logic, e.g., logic macrocells, that couple the output signals of logic allocator 615A to the I/O pins. The number within boxes BC0 to BC15 is the maximum number of product terms that logic allocator 615A can route to a particular macrocell and consequently to a particular I/O pin.

Each horizontal line within logic allocator 615A represents a router element. Each router element has an output line connected to a logic macrocell and the associated I/O pin. The numbers on a horizontal line within logic allocator 615A represent the product-term clusters, as numbered on the left-hand side of the figure, that can be connected to the output line of the router element.

As explained above, eight of the router elements within logic allocator 615A are programmably coupled to and decoupled to the same eight logic allocator input lines. Thus, each product-term cluster can be routed to one of eight I/O pins. More specifically, all signals on a plurality of input lines 701 of logic allocator 615A can be routed to any line in a plurality of output lines 711. Thus, each output line in plurality of output lines 711 has access to all the signals on the plurality of input lines 701.

Similarly, all signals on a plurality of input lines 702 of logic allocator 615A can be routed to any line in a plurality of output lines 712.

Programmable uniform distribution logic allocator 615A provides a uniform distribution of product terms to each I/O pin. Similarly, the macrocell feedback is uniform. There is the same maximum capacitive load associated with each router element in logic allocator 615A. Programmable uniform distribution logic allocator 615A utilizes the fixed product-term resources more efficiently than the prior art logic allocators, and supports logic design changes while maintaining a given pin-out without requiring an output switch matrix.

Figure 7B:
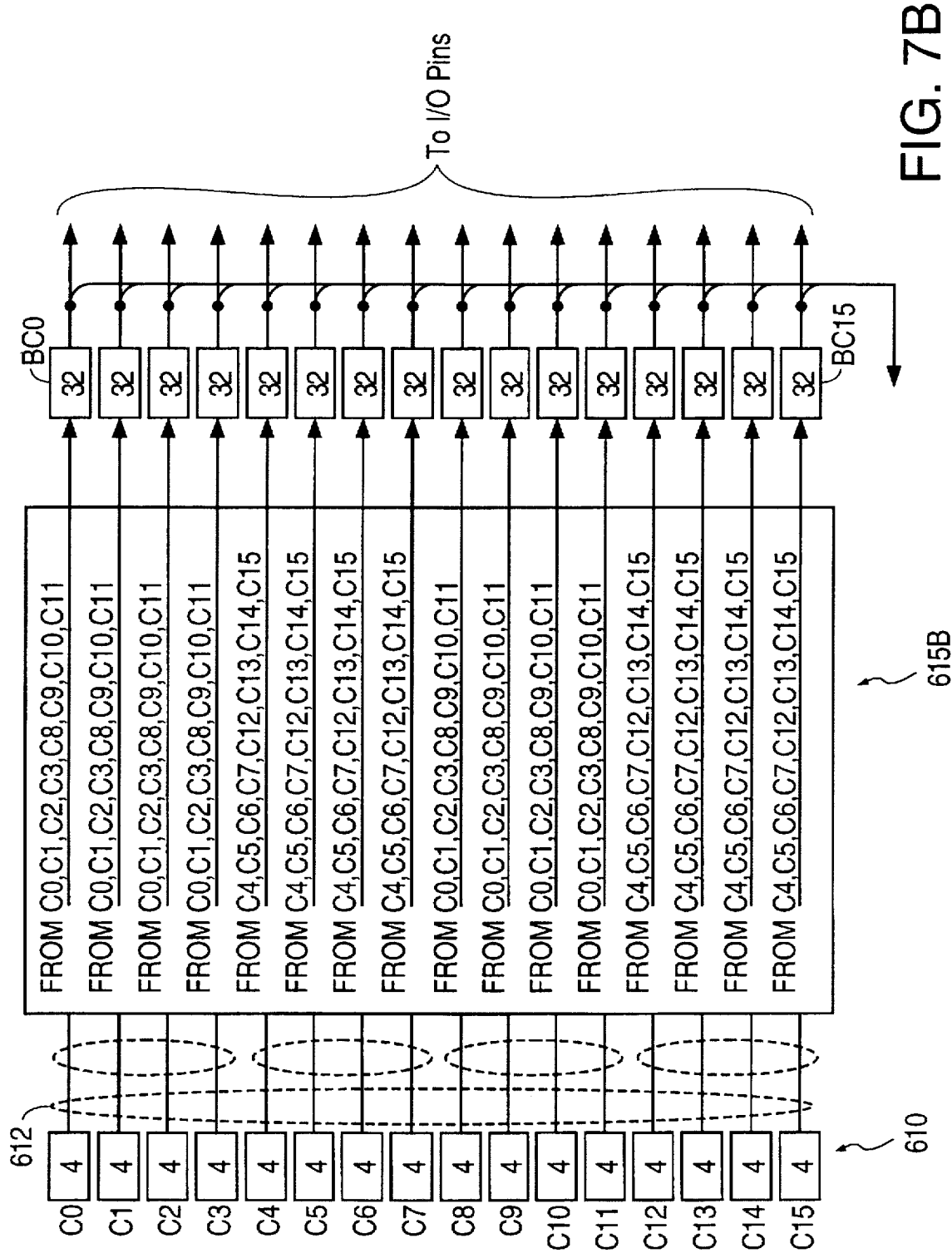
FIG. 7B is a representation of a second embodiment of the programmable uniform distribution logic allocator of this invention that illustrates the interconnection of the router elements and the distribution of product-term clusters to each output line in the CPLD of FIG. 6.

Yet another embodiment of programmable uniform distribution logic allocator 615B is illustrated in FIG. 7B. In FIG. 7B, again boxes C0 through C15 on the left-hand side of the figure, each of which contains the numeral "4", represent the product term-clusters, each of which has four product terms, in product-term array 610. On the right-hand side of FIG. 7B are sixteen boxes BC0 through BC15 which represent logic, e.g., logic macrocells, that couple the output signals of logic allocator 615B to the I/O pins. The number within boxes EC0 to BC15 is the maximum number of product terms that logic allocator 615B can route to a particular I/O pin.

Each horizontal line within logic allocator 615B represents a router element. Each router element has an output line connected to a logic macrocell and the associated I/O pin. The numbers on a horizontal line within logic allocator 615B represent the product-term clusters, as numbered on the left-hand side of the figure, that can be connected to the output line of the router element. Each router element programmably couples and decouples up to eight logic allocator input lines to the router element output terminal. Thus, each product-term cluster can be routed to anyone of eight I/O pins. In this embodiment, the logic allocator input lines coupled to and decoupled from a router element output terminal are grouped into sets of four and alternate sets of four are coupled to and decoupled from the router element output terminal.

Logic allocator 615B, like logic allocator 615A distributes the product terms uniformly and symmetrically to the I/O pins and each I/O pin has access to from zero to thirty-two product terms. Table 1 is an alternative representation of the distribution of product terms by logic allocator 615B.

TABLE 1

|     | BC0 | BC1 | BC2 | BC3 | BC4 | BC5 | BC6 | BC7 | BC8 | BC9 | BC10 | BC11 | BC12 | BC13 | BC14 | BC15 |
|-----|-----|-----|-----|-----|-----|-----|-----|-----|-----|-----|------|------|------|------|------|------|
| C0  | X   | X   | X   | X   |     |     |     |     | X   | X   | X    | X    |      |      |      |      |
| C1  | X   | X   | X   | X   |     |     |     |     | X   | X   | X    | X    |      |      |      |      |
| C2  | X   | X   | X   | X   |     |     |     |     | X   | X   | X    | X    |      |      |      |      |
| C3  | X   | X   | X   | X   |     |     |     |     | X   | X   | X    | X    |      |      |      |      |
| C4  |     |     |     |     | X   | X   | X   | X   |     |     |      |      | X    | X    | X    | X    |
| C5  |     |     |     |     | X   | X   | X   | X   |     |     |      |      | X    | X    | X    | X    |
| C6  |     |     |     |     | X   | X   | X   | X   |     |     |      |      | X    | X    | X    | X    |
| C7  |     |     |     |     | X   | X   | X   | X   |     |     |      |      | X    | X    | X    | X    |
| C8  | X   | X   | X   | X   |     |     |     |     | X   | X   | X    | X    |      |      |      |      |
| C9  | X   | X   | X   | X   |     |     |     |     | X   | X   | X    | X    |      |      |      |      |
| C10 | X   | X   | X   | X   |     |     |     |     | X   | X   | X    | X    |      |      |      |      |
| C11 | X   | X   | X   | X   |     |     |     |     | X   | X   | X    | X    |      |      |      |      |
| C12 |     |     |     |     | X   | X   | X   | X   |     |     |      |      | X    | X    | X    | X    |
| C13 |     |     |     |     | X   | X   | X   | X   |     |     |      |      | X    | X    | X    | X    |
| C14 |     |     |     |     | X   | X   | X   | X   |     |     |      |      | X    | X    | X    | X    |
| C15 |     |     |     |     | X   | X   | X   | X   |     |     |      |      | X    | X    | X    | X    |

This configuration introduces a maximum capacitive load of twelve because of the longer lines required to the router elements. However, this interconnect pattern within the logic allocator assists in more efficiently utilizing the logic when remapping is required.

Figure 5C:
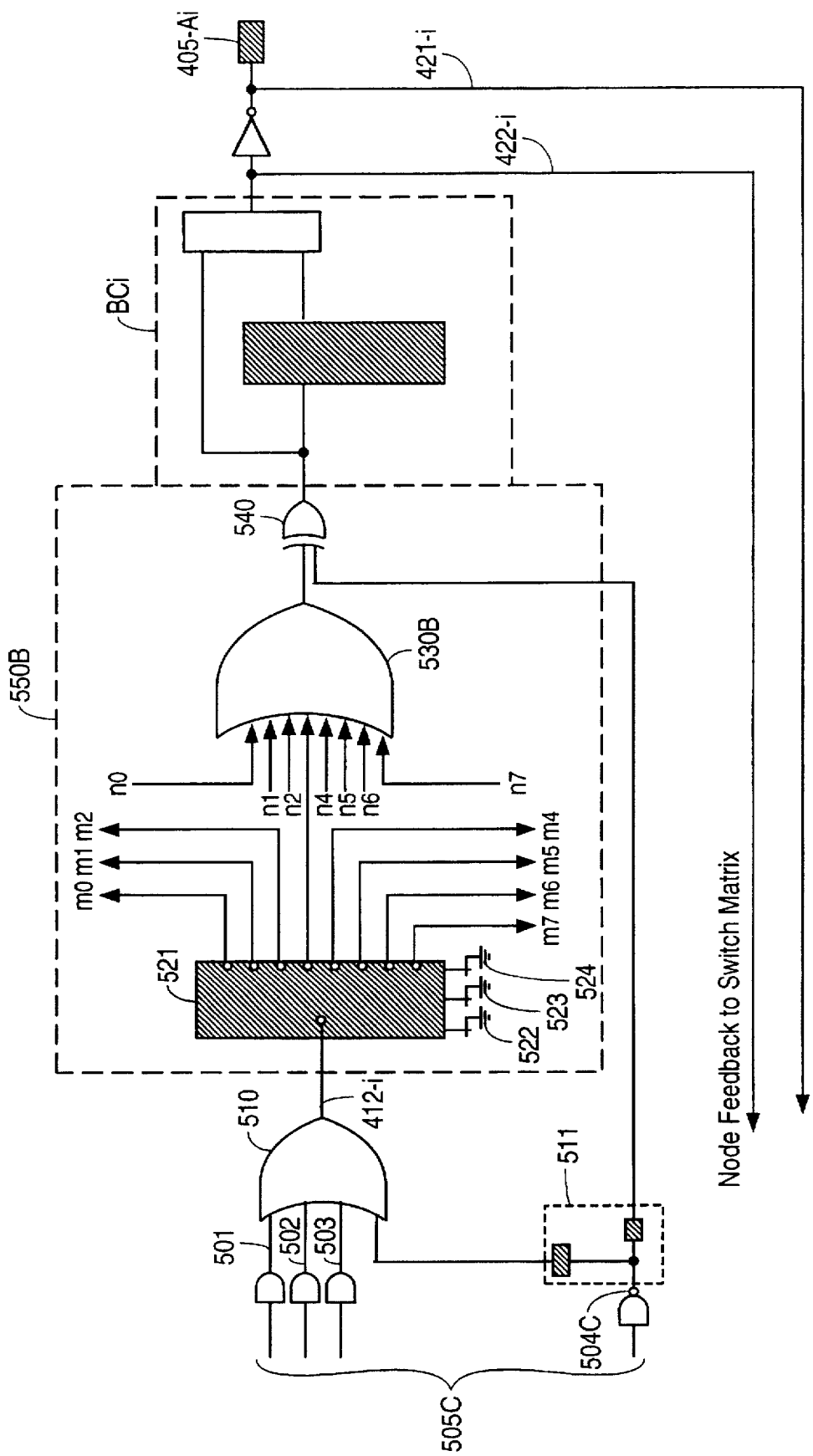
FIG. 5C is a representation of a third embodiment of a typical router element in the various embodiments of the programmable uniform distribution logic allocator of this invention.
Figure 5D:
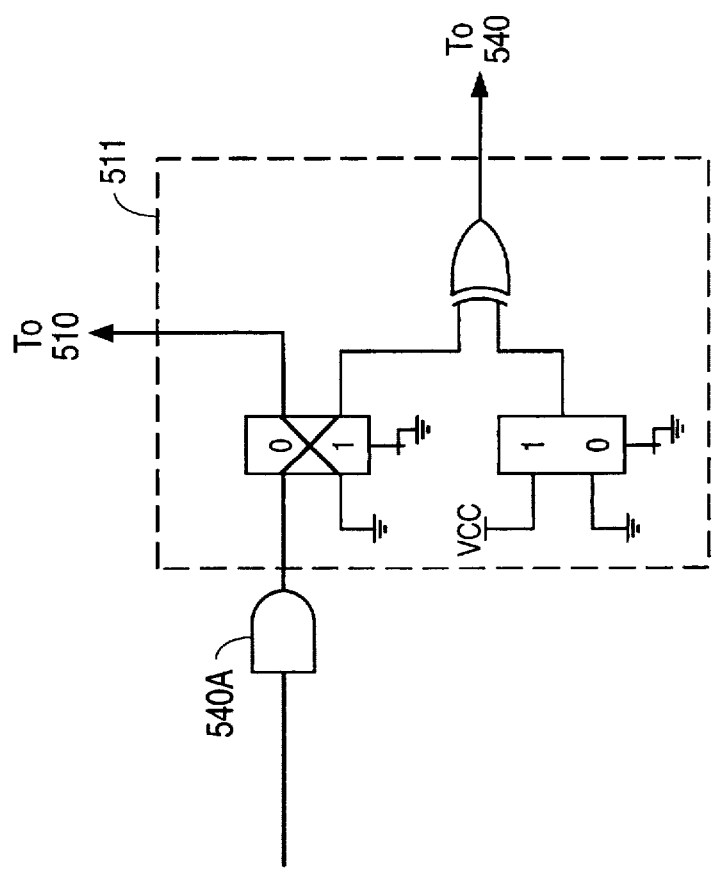
FIG. 5D is a more detailed diagram of the programmable connector of FIG. 5B.

The router elements utilized in logic allocators 615, 615A and 615B are the same as those illustrated in FIGS. 5A to 5C. As shown in FIG. 5B, for example, the fourth output terminal of programmable demultiplexer 521 is connected to an input terminal of OR gate 530B. The other seven output terminals are connected to input terminals of OR gates in the seven other router elements by lines m0 to m2, and m4 to m7 respectively. The specific location of the OR gates is given in FIGS. 7A and 7B. For example, if router element 550B is considered to be the eighth router element in logic allocator 615A, i.e., the router element with the input terminal connected to the OR gate driven by cluster C7, m0 is the OR gate in the first router element and m7 is the OR gate in the seventh router element. Specifically, the output terminals of programmable demultiplexer 521 are connected to the router elements that show cluster C7 on the horizontal line.

As described above, OR gate 530B in router element 550B has one input terminal connected to the fourth output terminal of programmable demultiplexer 721. The other seven input lines are connected to output terminals of seven programmable demultiplexers by lines n0 to n2 and n4 to n7. The specific location of the programmable demultiplexers is given in FIGS. 7A and 7B. For example, if router element 550B is again considered to be the eighth router element in logic allocator 615A, i.e., the router element with the input terminal connected to the OR gate driven by cluster C7, n0 is the programmable demultiplexer in the first router element and n7 is the programmable demultiplexer in the seventh router element, where the first router element is at the top of logic allocator 615A. Specifically, the input lines to OR gate 530B are connected to output terminals of demultiplexers having an input terminal connected to one of the clusters shown on the horizontal line that represents the eight router element.

The embodiments described above of the programmable uniform distribution logic allocator of this invention are illustrative of the principles of this invention and are not intended to limit the invention to the particular embodiments described. In one embodiment, the logic allocators of this invention are implemented using a 0.5 micron, three-metal layer electrically erasable CMOS technology. In another embodiment, the logic allocators of this invention are implemented using a 0.65 micron, two-metal layer electrically erasable CMOS technology. In view of this disclosure, those skilled in the art can implement the programmable uniform distribution logic allocator in a wide variety of ways and in a wide variety of CPLDs.

We claim:

1. In an integrated circuit, a programmable uniform distribution logic allocator comprising:

a plurality of N input lines where N is an integer;

a plurality of M output lines where M is an integer;

a first plurality of logic gates wherein each logic gate in said first plurality of logic gates includes:
a plurality of M/2 input terminals; and
an output terminal coupled to one output line in said plurality of M output lines;

a first plurality of programmable demultiplexers wherein each programmable demultiplexer includes:
an input terminal connected to an input line in said plurality of N input lines;
a plurality of M/2 output terminals wherein each output terminal in said plurality of M/2 output terminals is connected to an input terminal of a different logic gate in said first plurality of logic gates so that each output line coupled to one of said logic gates in said first plurality of logic gates has access to signals on each input terminal of said first plurality of programmable demultiplexers; and
said input terminal is programmably connectable to and disconnectable from said plurality of M/2 output terminals, and upon programmably connecting said input terminal to one of said plurality of M/2 output terminals, said input terminal is disconnected from all other output terminals in said plurality of M/2 output terminals;

a second plurality of logic gates wherein each logic gate in said second plurality of logic gates includes:
a plurality of M/2 input terminals; and
an output terminal coupled to one output line in said plurality of M output lines of said programmable uniform distribution logic allocator; and a second plurality of programmable demultiplexers wherein each programmable demultiplexer includes:
an input terminal connected to an input line in said plurality of N input lines;
a plurality of M/2 output terminals wherein each output terminal in said plurality of M/2 output terminals is connected to an input terminal of a different logic gate in said second plurality of logic gates so that each output line coupled to one of said logic gates in said second plurality of logic gates has access to signals on each input terminal of said second plurality of programmable demultiplexers; and
said input terminal is programmably connectable to and disconnectable from said plurality of M/2 output terminals wherein upon programmably connecting said input terminal to one of said plurality of M/2 output terminals, said input terminal is disconnected from all other output terminals in said plurality of M/2 output terminals.

2. In an integrated circuit, a programmable uniform distribution logic allocator as in claim 1 wherein said integer N is equal to said integer M.

3. In an integrated circuit, a programmable uniform distribution logic allocator as in claim 1 wherein said integer N is sixteen.

4. In an integrated circuit, a programmable uniform distribution logic allocator as in claim 1 wherein said integer M is sixteen.

5. In an integrated circuit, a programmable uniform distribution logic allocator as in claim 1 further comprising:
a first plurality of exclusive-OR gates wherein each exclusive-OR gate in said first plurality of exclusive-OR gate has an input terminal connected to said output terminal of one logic gate in said first plurality of logic gates, and an output terminal connected to said output line in said plurality of M output lines, coupled to said output terminal of said one logic gate.

6. In an integrated circuit, a programmable uniform distribution logic allocator as in claim 1 wherein each logic gate output terminal is connected to one output line in said plurality of M output lines.

7. In an integrated circuit, a programmable uniform distribution logic allocator as in claim 5 further comprising:
a second plurality of exclusive-OR gates wherein each exclusive-OR gate, in said second plurality of exclusive OR gates, has an input terminal connected to said output terminal of one logic gate in said second plurality of logic gates, and an output terminal connected to said output line, in said plurality of M output lines, coupled to said output terminal of said one logic gate.

* * * * *